(12) United States Patent
Kishimoto et al.

(10) Patent No.: US 11,614,777 B2
(45) Date of Patent: Mar. 28, 2023

(54) ELECTRONIC APPARATUS AND METHOD FOR MANUFACTURING THE SAME

(71) Applicant: Samsung Display Co., Ltd., Yongin-Si (KR)

(72) Inventors: Hirotsugu Kishimoto, Hwaseong-si (KR); Jeongil Yoo, Seoul (KR); Yunjae Kim, Cheonan-si (KR); Jaiku Shin, Hwaseong-si (KR); Dongho Lee, Cheonan-si (KR); Sung-Ki Jung, Asan-si (KR); Chul Ho Jeong, Seoul (KR); Seungkyun Hong, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/368,012

(22) Filed: Jul. 6, 2021

(65) Prior Publication Data

US 2022/0100234 A1 Mar. 31, 2022

(30) Foreign Application Priority Data

Sep. 25, 2020 (KR) .......................... 10-2020-0125118

(51) Int. Cl.
*G06F 1/16* (2006.01)
*H01L 51/52* (2006.01)
(Continued)

(52) U.S. Cl.
CPC .......... *G06F 1/1641* (2013.01); *G06F 1/1616* (2013.01); *G06F 1/1652* (2013.01);
(Continued)

(58) Field of Classification Search
CPC ......... G06F 3/0412; G06F 2203/04102; G06F 3/0446; G06F 1/1643; G06F 3/046;
(Continued)

(56) References Cited

U.S. PATENT DOCUMENTS 9,870,072 B2 1/2018 Lee et al.
10,691,175 B2 6/2020 Lee
(Continued)

FOREIGN PATENT DOCUMENTS

KR 101668225 B1 10/2016
KR 1020180047603 A 5/2018
(Continued)

*Primary Examiner* — Dismery Mercedes
(74) *Attorney, Agent, or Firm* — Cantor Colburn LLP

(57) ABSTRACT

An electronic apparatus includes a display panel having non-folding areas arranged along a first direction, and a folding area disposed between the non-folding areas and folded along an imaginary folding axis extending in a second direction crossing the first direction, a lower protective film disposed below the display panel, a detection sensor disposed below the protective film, and a lower member disposed below the detection sensor. The detection sensor includes a digitizer including first sensing coils and second sensing coils, which are insulated and spaced apart from each other, and a shielding layer disposed below the digitizer. The shielding layer overlaps the folding area and a shielding opening is defined through the shielding layer.

20 Claims, 19 Drawing Sheets

(51) Int. Cl.
*H01L 51/00* (2006.01)
*G06F 3/046* (2006.01)
*G06F 3/044* (2006.01)
*H01L 51/56* (2006.01)

(52) U.S. Cl.
CPC .......... *G06F 1/1656* (2013.01); *G06F 3/046* (2013.01); *G06F 3/0446* (2019.05); *H01L 51/0097* (2013.01); *H01L 51/5253* (2013.01); *H01L 51/5281* (2013.01); *H01L 51/5284* (2013.01); *H01L 51/56* (2013.01); *G06F 2203/04102* (2013.01); *G06F 2203/04103* (2013.01); *G06F 2203/04107* (2013.01)

(58) Field of Classification Search
CPC ......... G06F 2203/04103; G06F 3/0416; G06F 1/1652; G06F 2203/04107; G06F 1/1641; G06F 1/1656; G06F 1/1616; H01L 51/5237; H01L 51/5253; H01L 27/323; H01L 51/0097; H01L 23/645; H01L 23/55; H01L 2251/5338; H01L 2251/0097; H01L 2251/5284; H01L 2251/56; H01L 2251/5253
See application file for complete search history.

(56) References Cited

U.S. PATENT DOCUMENTS

| | | | |
|---|---|---|---|
| 10,838,457 B2* | 11/2020 | Yu | G06F 1/1681 |
| 11,308,730 B2* | 4/2022 | Ryu | G06V 40/1324 |
| 2014/0362012 A1 | 12/2014 | Lee et al. | |
| 2017/0278899 A1* | 9/2017 | Yang | G06F 3/0412 |
| 2018/0122863 A1* | 5/2018 | Bok | G06F 3/0443 |
| 2018/0136762 A1* | 5/2018 | Jeong | G06F 3/0445 |
| 2018/0322848 A1* | 11/2018 | Wu | G09G 3/3666 |
| 2018/0341290 A1* | 11/2018 | Sim | H05K 5/0017 |
| 2019/0036068 A1* | 1/2019 | Kim | G06F 1/1652 |
| 2019/0204867 A1* | 7/2019 | Song | G06F 1/1652 |
| 2020/0209998 A1 | 7/2020 | Shin et al. | |
| 2020/0225699 A1* | 7/2020 | Yu | H04M 1/0216 |
| 2021/0034180 A1* | 2/2021 | Hirotsugu | G06F 3/046 |
| 2021/0333934 A1 | 10/2021 | Kishimoto et al. | |
| 2021/0400852 A1* | 12/2021 | Kim | H05K 7/20954 |
| 2022/0011889 A1* | 1/2022 | Shin | G06F 3/046 |
| 2022/0129094 A1* | 4/2022 | Tatsuno | G06F 1/1616 |

FOREIGN PATENT DOCUMENTS

| | | |
|---|---|---|
| KR | 1020190081341 A | 7/2019 |
| KR | 1020190082339 A | 7/2019 |
| KR | 102173060 B1 | 11/2020 |
| KR | 1020210131512 A | 11/2021 |

* cited by examiner

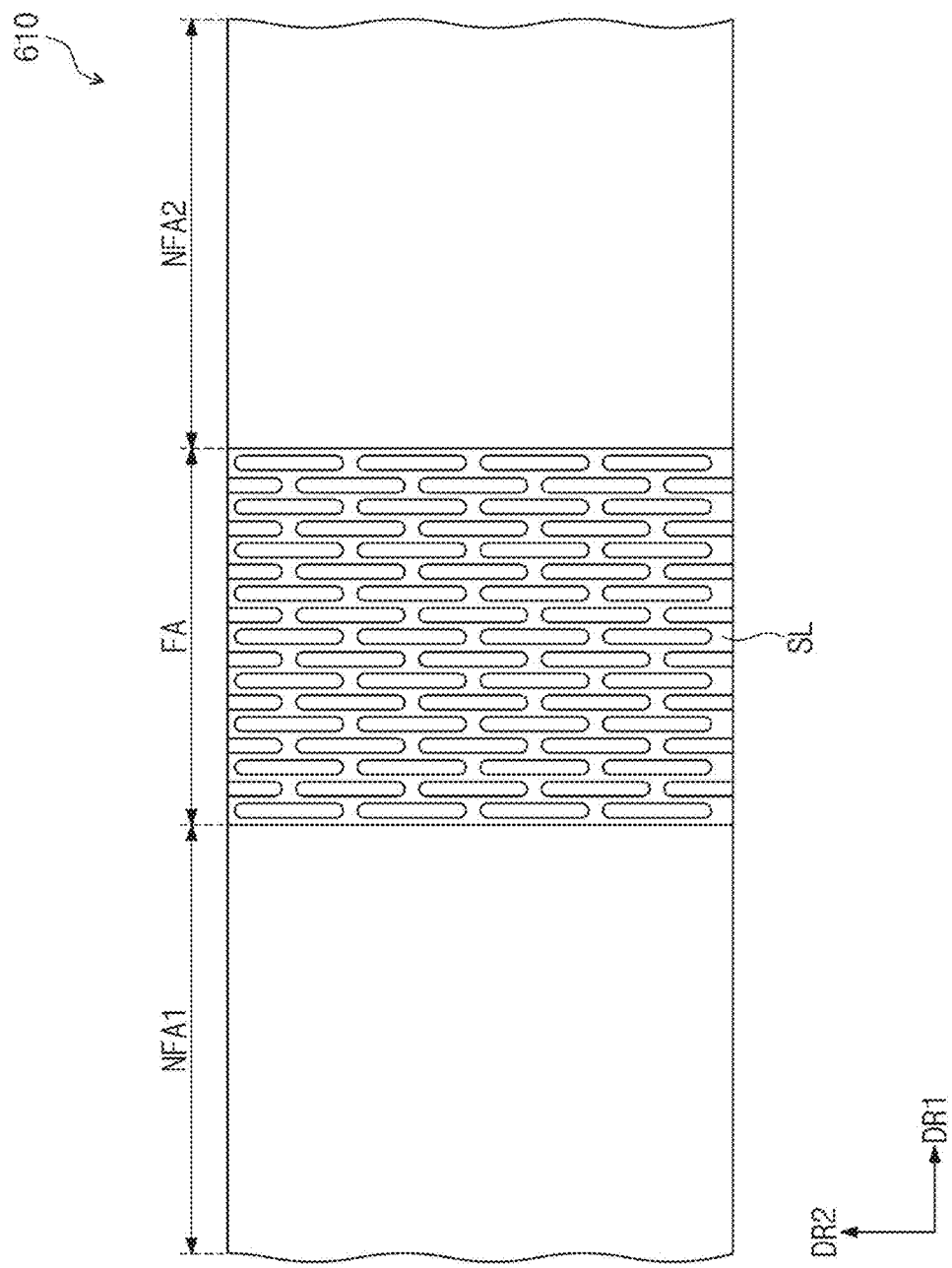

ELECTRONIC APPARATUS AND METHOD FOR MANUFACTURING THE SAME

This application claims priority to Korean Patent Application No. 10-2020-0125118, filed on Sep. 25, 2020, and all the benefits accruing therefrom under 35 U.S.C. § 119, the content of which in its entirety is herein incorporated by reference.

BACKGROUND

1. Field

The disclosure herein relates to a detection sensor, an electronic apparatus including the detection sensor, and a method for manufacturing the electronic apparatus, and more particularly, to an electronic apparatus having improved reliability.

2. Description of the Related Art

In the information society, electronic apparatuses as a transmission medium for visual information has been widely used. Types of display devices included in electronic apparatuses include a liquid crystal display ("LCD"), a plasma display panel ("PDP"), an organic light emitting display ("OLED"), a field effect display ("FED"), an electrophoretic displays ("EPD"), etc.

The electronic apparatuses typically receive electrical signals to be activated. The display apparatuses may include detection sensors that detect inputs applied from outside a display layer for displaying images.

The display apparatuses may include various electrode patterns to be activated through electrical signals. Areas where the electrode patterns are activated may display information or respond to signals applied from the outside.

SUMMARY

The disclosure provides an electronic apparatus including a detection sensor that detects external inputs with improved reliability.

An embodiment of the invention provides an electronic apparatus including a display panel including non-folding areas arranged along a first direction, and a folding area disposed between the non-folding areas and folded along an imaginary folding axis extending in a second direction crossing the first direction, a lower protective film disposed below the display panel, a detection sensor disposed below the protective film, where the detection sensor includes a digitizer including first sensing coils and second sensing coils, which are insulated and spaced apart from each other, and a shielding layer disposed below the digitizer, and a lower member disposed below the detection sensor. In such an embodiment, the shielding layer overlaps the folding area, and a shielding opening is defined through the shielding layer.

In an embodiment, the lower member may overlap the shielding opening, and a lower opening may be defined through the lower member.

In an embodiment, the detection sensor may include an adhesive layer bonding the digitizer and the shielding layer to each other, where the adhesive layer may overlap the shielding opening, and an adhesive opening may be defined through the adhesive layer.

In an embodiment, a side surface of the adhesive layer defining the adhesive opening and a side surface of the shielding layer defining the shielding opening may be aligned with each other along a thickness direction of the display panel.

In an embodiment, a side surface of the lower member defining the lower opening and a side surface of the shielding layer defining the shielding opening may be aligned with each other along the thickness direction.

In an embodiment, the adhesive opening may overlap a whole area of the folding area.

In an embodiment, the shielding opening may have a width in a range of about 0.1 millimeter (mm) to about 1.0 mm in the first direction.

In an embodiment, the shielding layer may include a magnetic metal powder ("MMP").

In an embodiment, the electronic apparatus may further include a disposed below the lower member, the functional member may include at least one selected from a lower plate, a heat dissipation sheet, and an insulating film.

In an embodiment, the lower plate may be provided in plural to be spaced apart from each other with respect to the folding area and to overlap a corresponding non-folding area among the non-folding areas.

In an embodiment, the cushion member may be disposed below the functional member.

In an embodiment, the shielding layer may be in contact with the lower member.

In an embodiment, the display panel may include a display layer including a plurality of pixels, and a sensor layer disposed directly on the display layer, where the sensor layer detects an external input.

In an embodiment, the detection sensor may detect an external input through an electromagnetic resonance ("EMR") method.

In an embodiment, The digitizer may include a base layer having a front surface adjacent to the display panel and a rear surface opposite to the front surface, the first sensing coils disposed on the front surface of the base layer, a first cover layer covering the front surface of the base layer, the second sensing coils disposed on the rear surface of the base layer, and a second cover layer covering the rear surface of the base layer.

In an embodiment, the digitizer may include a base layer containing polyimide, the first sensing coils adjacent to the display panel and embedded in the base layer, and the second sensing coils adjacent to the lower member and embedded in the base layer.

In an embodiment, the digitizer may include a first cover layer, the first sensing coils disposed on the first cover layer, a second cover layer covering the first sensing coils, the second sensing coils disposed on the second cover layer, a sensing adhesive layer covering the second sensing coils, and a protective layer disposed on the sensing adhesive layer.

In an embodiment of the invention, an electronic apparatus includes a display panel including non-folding areas arranged along a first direction, and a folding area disposed between the non-folding areas and folded along an imaginary folding axis extending in a second direction crossing the first direction, a lower protective film disposed below the display panel, a lower cushion member disposed below the display panel, a detection sensor disposed below the protective film, where the detection sensor includes a digitizer including first sensing coils and second sensing coils, which are insulated and spaced apart from each other, and a shielding layer disposed below the digitizer, where a shielding opening is defined through a portion of the shielding layer overlapping the folding area, and a lower member disposed below the detection sensor, where a lower opening is defined through a portion of the lower member overlapping the folding area. In such an embodiment, a side surface of the lower member defining the lower opening is aligned with a side surface of the shielding layer defining the shielding opening.

In an embodiment, the detection sensor may include an adhesive layer bonding the digitizer and the shielding layer to each other, where the adhesive layer may overlap the shielding opening, and an adhesive opening may be defined through the adhesive layer.

In an embodiment, a side surface of the adhesive layer defining the adhesive opening and a side surface of the shielding layer defining the shielding opening may be aligned with each other along a thickness direction of the display panel.

In an embodiment of the invention, a method for manufacturing an electronic apparatus includes providing an initial shielding layer having magnetic metal powder on an initial upper plate including a metal, providing an upper plate by forming a lower opening sing through the initial upper plate, providing a shielding layer by forming a shielding opening through the initial shielding layer, providing a digitizer on the shielding layer, where the digitizer includes first sensing coils and second sensing coils, which are insulated and spaced apart from each other, and attaching a display panel to the digitizer. In such an embodiment, the lower opening and the shielding opening are formed by forming an opening through the initial upper plate and the initial shielding layer together.

BRIEF DESCRIPTION OF THE DRAWINGS

The above and other features of the invention will become more apparent by describing in further detail embodiments thereof with reference to the accompanying drawings, in which:

FIG. 3B is a plan view of an upper plate according to an embodiment of the invention;

DETAILED DESCRIPTION

Figure 1A:
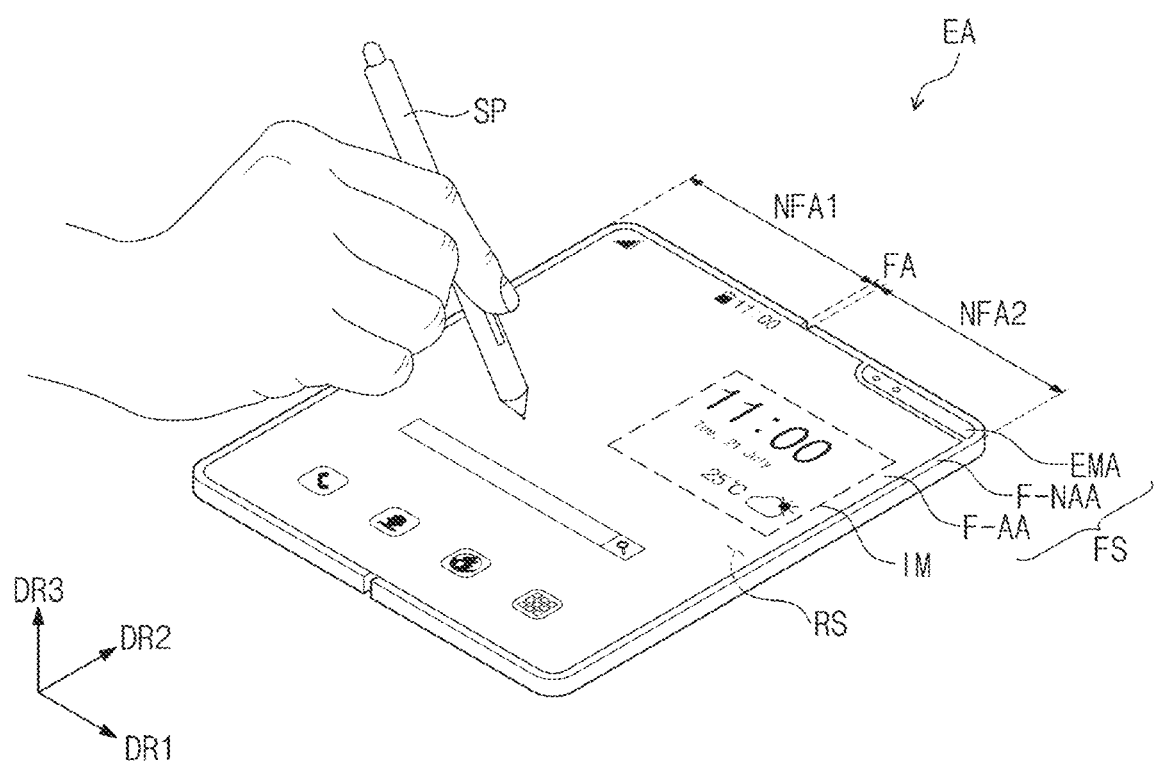
FIG. 1A is a perspective view of an electronic apparatus in an unfolded state according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the description, when an element (or a region, a layer, a portion, etc.) is referred to as being "on," "connected to," or "coupled to" another element, it means that the element may be directly disposed on/connected to/coupled to the other element, or that a third element may be disposed therebetween. In contrast, when an element is referred to as being "directly on", "connected directly to," or "coupled directly to" another element, there are no intervening elements present.

Like reference numerals refer to like elements. Also, in the drawings, the thickness, the ratio, and the dimensions of elements are exaggerated for an effective description of technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
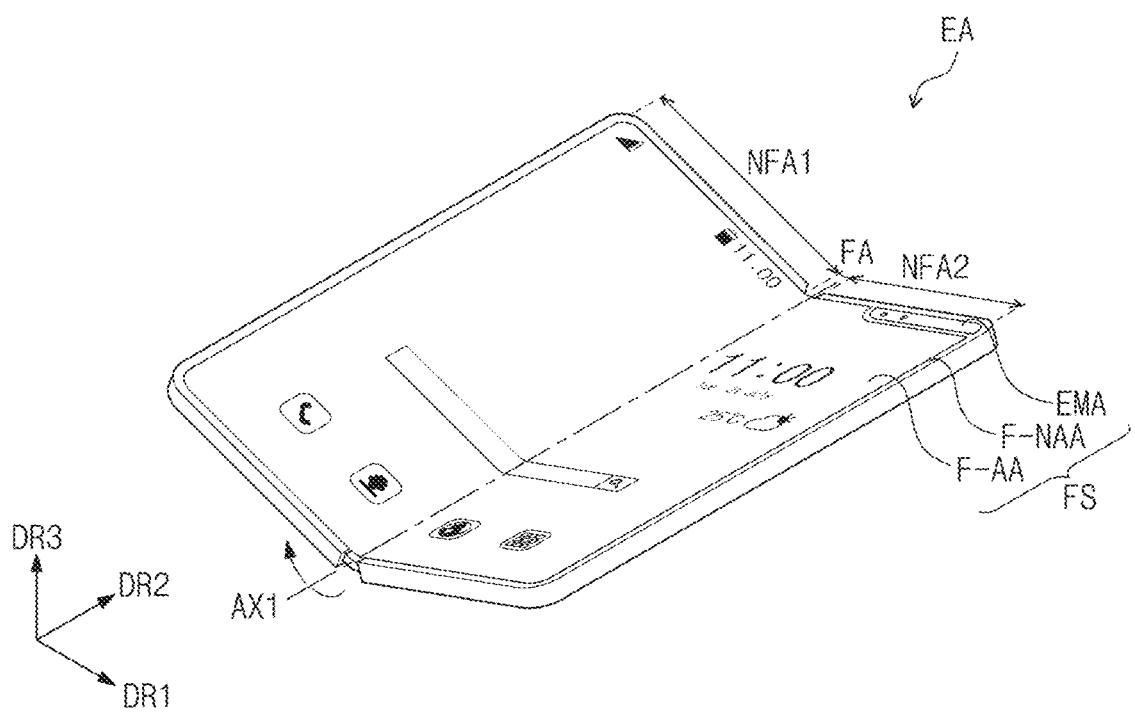
FIG. 1B is a perspective view of an electronic apparatus according to an embodiment of the invention.
Figure 1C:
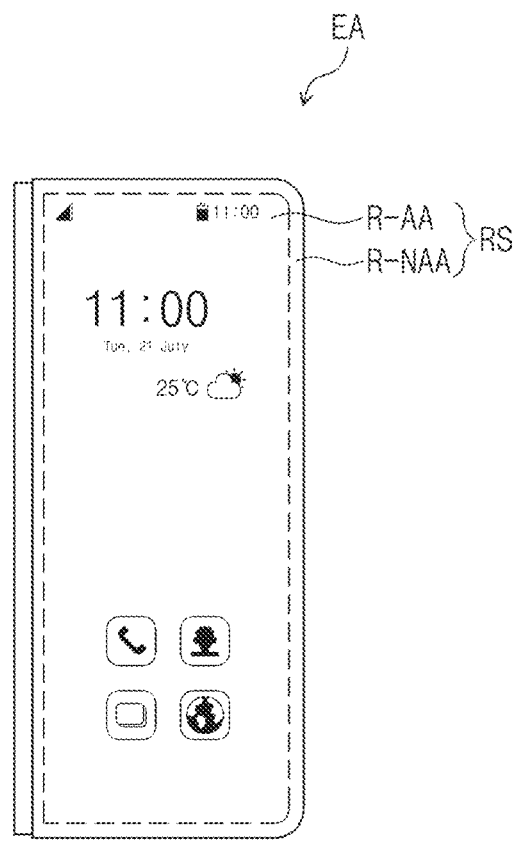
FIG. 1C is a plan view of an electronic apparatus in a folded state according to an embodiment of the invention.
Figure 1D:
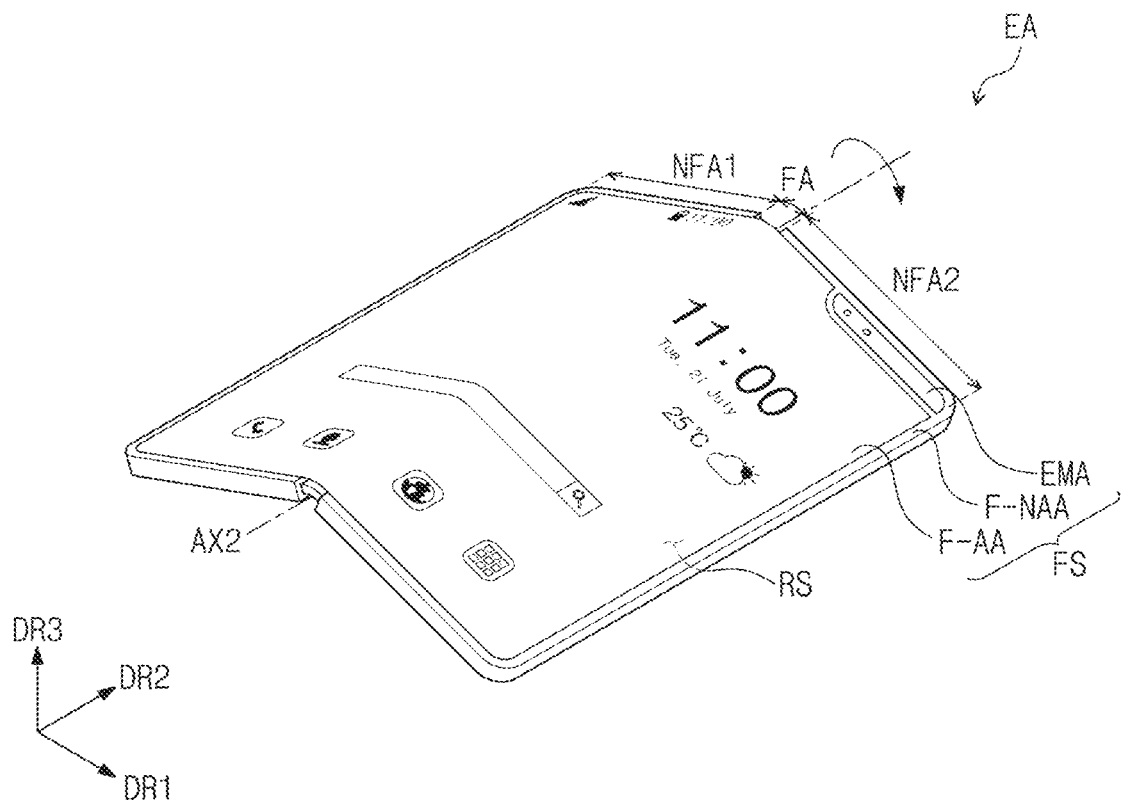
FIG. 1D is a perspective view of an electronic apparatus according to an embodiment of the invention.
Figure 2:
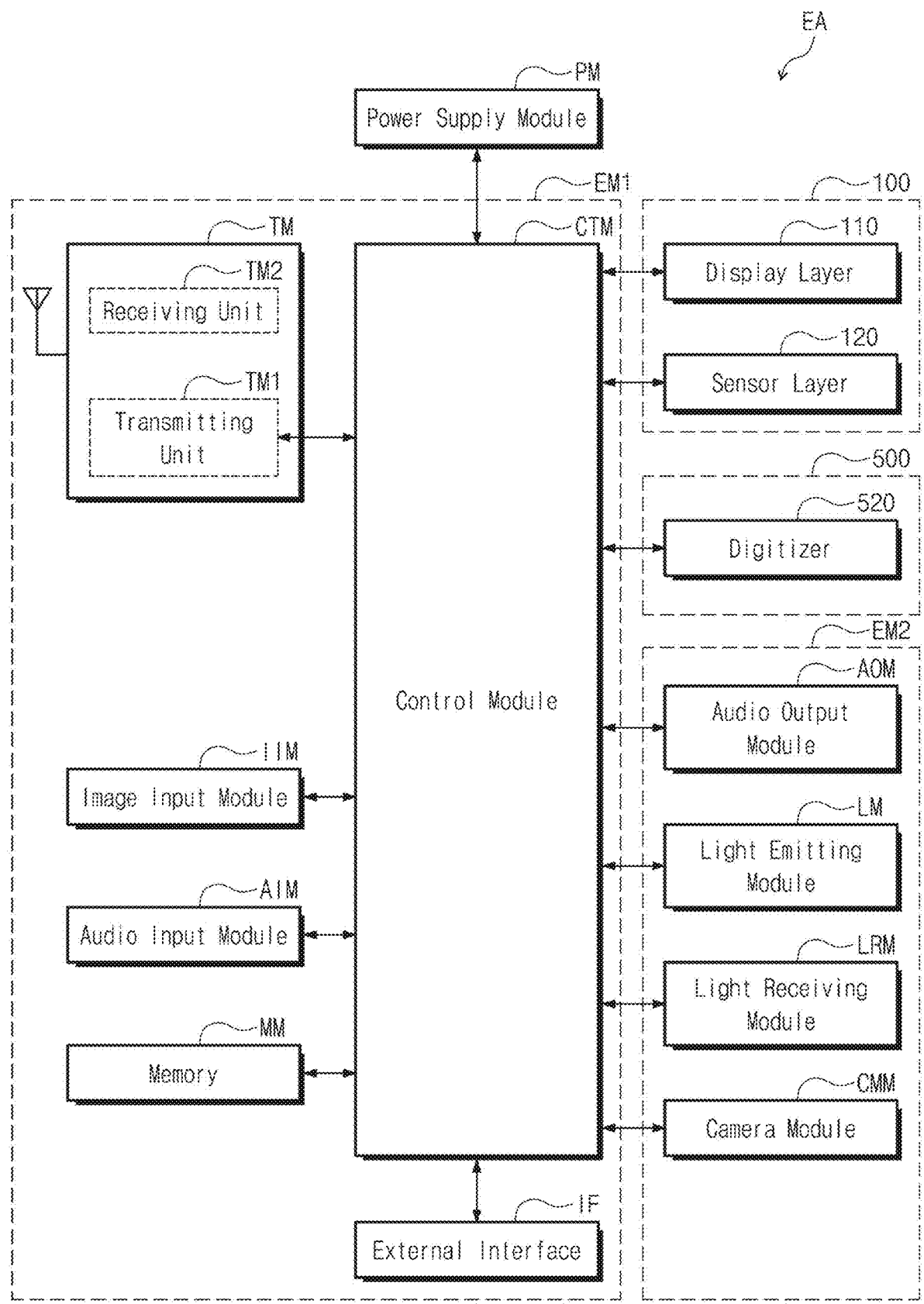
FIG. 2 is a block diagram of an electronic apparatus according to an embodiment of the invention.

FIG. 1A is a perspective view of an electronic apparatus in an unfolded state according to an embodiment of the invention. FIG. 1B is a perspective view of an electronic apparatus according to an embodiment of the invention. FIG. 1C is a plan view of an electronic apparatus in a folded state according to an embodiment of the invention. FIG. 1D is a perspective view of an electronic apparatus according to an embodiment of the invention. FIG. 2 is a block diagram of an electronic apparatus according to an embodiment of the invention.

Referring to FIG. 1A, an embodiment of an electronic apparatus EA may be a device activated based on electrical signals. The electronic apparatus EA may be one of various types of electronic device. In one embodiment, for example, the electronic apparatus EA may be a tablet personal computer ("PC"), a laptop computer, a desktop computer, a smart television, etc. In an embodiment, the electronic apparatus EA may be a smartphone, as shown in FIGS. 1A to 1D.

The electronic apparatus EA may display an image IM towards a third direction DR3 on a first display surface FS parallel to a first direction DR1 and a second direction DR2, respectively. The first display surface FS for displaying the image IM may correspond to a front surface of the electronic apparatus EA. The image IM may include a still image as well as a dynamic image. In an embodiment, the image IM may include an Internet search window and a watch window as illustrated in FIG. 1A.

In an embodiment, a front surface (or an upper surface) and a rear surface (or a lower surface) of respective members of the electronic apparatus EA are defined with respect to a direction in which the image IM is displayed. Front and rear surfaces may oppose each other in a third direction DR3 and the normal direction of each of the front and rear surfaces may be parallel to the third direction DR3.

The distance between the front and rear surfaces in the third direction DR3 may correspond to the thickness/height in the third direction DR3 of the electronic apparatus EA. Here, directions indicated by the first to third directions DR1, DR2, and DR3 are relative concepts, and may thus be changed to other directions.

The electronic apparatus EA may detect external inputs applied from an outside. The external inputs may include various forms of inputs provided from outside the electronic apparatus EA.

In one embodiment, for example, the external inputs may include external inputs applied when approaching the electronic apparatus EA or being adjacent by a predetermined distance (e.g., hovering), as well as contact by a part of a body such as a user's hand. In an embodiment, the external inputs may have various forms such as force, pressure, temperature, light, etc.

FIG. 1A illustrates an embodiment where an external input is applied through a user's pen SP. Although not shown, the pen SP may be mounted or detached inside or outside the electronic apparatus EA, and the electronic apparatus EA may provide and receive signals corresponding to the mounting and detachment of the pen SP.

In an embodiment, the electronic apparatus EA may include a first display surface FS and a second display surface RS. The first display surface FS may include a first active area F-AA, a first peripheral area F-NAA, and an electronic module area EMA. The second display surface RS may be defined as a surface opposite to at least a portion of the first display surface FS.

The first active area F-AA may be an area activated based on electrical signals. The first active area F-AA is an area for displaying an image IM and detecting various forms of external inputs. The first peripheral area F-NAA is adjacent to the first active area F-AA. The first peripheral area F-NAA may have a predetermined color. The first peripheral area F-NAA may surround the first active area F-AA. Accordingly, the shape of the first active area F-AA may be substantially defined by the first peripheral area F-NAA, but not being limited thereto. Alternatively, the first peripheral area F-NAA may be disposed adjacent to only one side of the first active area F-AA, or may be omitted.

The electronic module area EMA may include various electronic modules disposed therein. In one embodiment, for example, the electronic module may include at least one selected from a camera, a speaker, a light detection sensor, and a heat detection sensor. The electronic module area EMA may detect an external subject received through display surfaces FS and RS, or provide sound signals such as voice to the outside through the display surfaces FS and RS. The electronic module may include a plurality of components, but not being limited to those described above.

In an embodiment, the electronic module area EMA may be surrounded by the first active area F-AA and the first peripheral area F-NAA. However, the embodiment of the invention is not limited thereto, and alternatively, the electronic module area EMA may be disposed in the first active area F-AA, but is not particularly limited.

An embodiment of the electronic apparatus EA may include at least one folding area FA and a plurality of non-folding areas NFA1 and NFA2 extending from the folding area FA. The non-folding areas NFA1 and NFA2 may be disposed to be spaced apart from each other with the folding area FA therebetween.

Referring to FIG. 1B, an embodiment of the electronic apparatus EA includes a first imaginary folding axis AX1 extending in the second direction DR2. The first folding axis AX1 may extend along the second direction DR2 on the first display surface FS. In an embodiment, the non-folding areas NFA1 and NFA2 may extend from the folding area FA with the folding area FA therebetween. In one embodiment, for example, the first non-folding area NFA1 may extend along one side of the folding area FA in the first direction DR1, and the second non-folding area NFA2 may extend along an opposing side of the folding area FA1 in the first direction DR1.

The electronic apparatus EA may be folded with respect to the first folding axis AX1 in an in-folding manner such that one area overlapping the first non-folding area NFA1 and the other area overlapping the second non-folding area NFA2 on the first display surface FS face each other.

Referring to FIG. 1C, in an embodiment of the electronic apparatus EA, the second display surface RS may be viewed in an in-folded state by users. In such an embodiment, the second display surface RS may include a second active area R-AA displaying images. The second active area R-AA may be an area activated based on electrical signals. The second active area R-AA is an area for displaying images and detecting various forms of external inputs.

A second peripheral area R-NAA is adjacent to the second active area R-AA. The second peripheral area R-NAA may have a predetermined color. The second peripheral area R-NAA may surround the second active area R-AA. In an embodiment, although not shown, the second display surface RS may further include an electronic module area in which an electronic module including various components is disposed, and is not limited thereto.

Referring to FIG. 1D, an embodiment of the electronic apparatus EA includes a second imaginary folding axis AX2 extending in the second direction DR2. The second folding axis AX2 may extend along the second direction DR2 on the second display surface RS.

The electronic apparatus EA may be folded with respect to the second folding axis AX2 in an out-folding manner such that one area overlapping the first non-folding area NFA1 and the other area overlapping the second non-folding area NFA2 on the second display surface RS face each other.

However, the embodiment of the invention is not limited thereto, and alternatively, the electronic apparatus EA may be folded with respect to a plurality of folding axes such that portions of each of the first display surface FS and the second display surface RS may face each other, and the number of folding axes and the number of corresponding non-folding areas are not limited to those described above.

Referring to FIG. 2, an embodiment of the electronic apparatus EA may include a display panel 100, a power supply module PM, a first electronic module EM1, and a second electronic module EM2. The display panel 100, a detection sensor 500, the power supply module PM, the first electronic module EM1, and the second electronic module EM2 may be electrically connected to one another.

The display panel 100 may include a display layer 110 and a sensor layer 120. The display layer 110 may be a component for substantially generating images. The images generated in the display layer 110 are viewed by users from the outside through the first display surface FS.

The first electronic module EM1 and the second electronic module EM2 may include various functional modules for operating the electronic apparatus EA. The first electronic module EM1 may be mounted on a motherboard electrically connected to the display panel 100 or may be mounted on a separate substrate to be electrically connected to a motherboard through a connector (not shown).

The first electronic module EM1 may include a control module CTM, a wireless communication module TM, an image input module IIM, an audio input module AIM, a memory MM, and an external interface IF. Some of the above-mentioned modules may not be mounted on a motherboard, and may be electrically connected to the motherboard through a flexible circuit board.

The control module CTM controls an overall operation of the electronic apparatus EA. The control module CTM may be a microprocessor. In one embodiment, for example, the control module CTM activates or deactivates the display panel 100. The control module CTM may control other modules such as the image input module IIM or the audio input module AIM based on touch signals received from the display panel 100.

The wireless communication module TM may transmit/receive wireless signals to/from other terminals using a Bluetooth or Wi-Fi line. The wireless communication module TM may transmit/receive voice signals using a general communication line. The wireless communication module TM includes a transmitting unit TM1 that modulates signals to be transmitted and transmits the signals, and a receiving unit TM2 that demodulates the received signals.

The image input module IIM processes image signals and converts the signals into image data that are displayable on the display panel 100. The audio input module AIM receives external sound signals through a microphone in a recording mode, a voice recognition mode, etc., and converts the signals into electrical voice data.

The external interface IF serves as an interface connected to an external charger, a wired/wireless data port, a card socket (e.g., a memory card, a SIM/UIM card), etc.

The second electronic module EM2 may include an audio output module AOM, a light emitting module LM, a light receiving module LRM, and a camera module CMM. Such components of the second electronic module EM2 may be mounted on a motherboard, or mounted on a separate substrate to be electrically connected to the display panel 100 through a connector (not shown), or electrically connected to the first electronic module EM1.

The audio output module AOM converts sound data received from the wireless communication module TM or sound data stored in the memory MM and outputs the data to the outside.

The light emitting module LM generates and outputs light. The light emitting module LM may output infrared light. In one embodiment, for example, the light emitting module LM may include an LED element. In one embodiment, for example, the light receiving module LRM may detect infrared light. The light receiving module LRM may be activated when infrared light of a predetermined level or higher is detected. The light receiving module LRM may include a complementary metal oxide semiconductor ("CMOS") sensor. After the infrared light generated from the light emitting module LM is output, the light is reflected by an external subject (e.g., a user's finger or face), and the reflected infrared light may be incident on the light receiving module LRM. The camera module CMM captures external images.

The detection sensor 500 may include a digitizer 520. The digitizer 520 may include a plurality of sensing coils and detect external inputs through an electromagnetic resonance ("EMR") method. The EMR method generates a magnetic field in a resonance circuit disposed inside the pen SP, and the vibrating magnetic field induces signals to a plurality of coils included in the digitizer 520 and detects the positions of external inputs through the signals induced to the coils. The digitizer 520 will be described later in detail.

In an embodiment, although not shown, the electronic apparatus EA may further include a transparent member disposed between the electronic modules and the display panel 100. The transparent member may be an optically transparent film to allow external inputs transmitted through the first display surface FS to pass through the transparent member and to be transmitted to the electronic module.

The transparent member may be attached to a rear surface of the display panel 100 or may be disposed between the display panel 100 and the electronic module without a separate adhesive layer. Embodiments of the electronic apparatus may be modified in various configurations, and is not limited to any one embodiment.

Figure 3A:
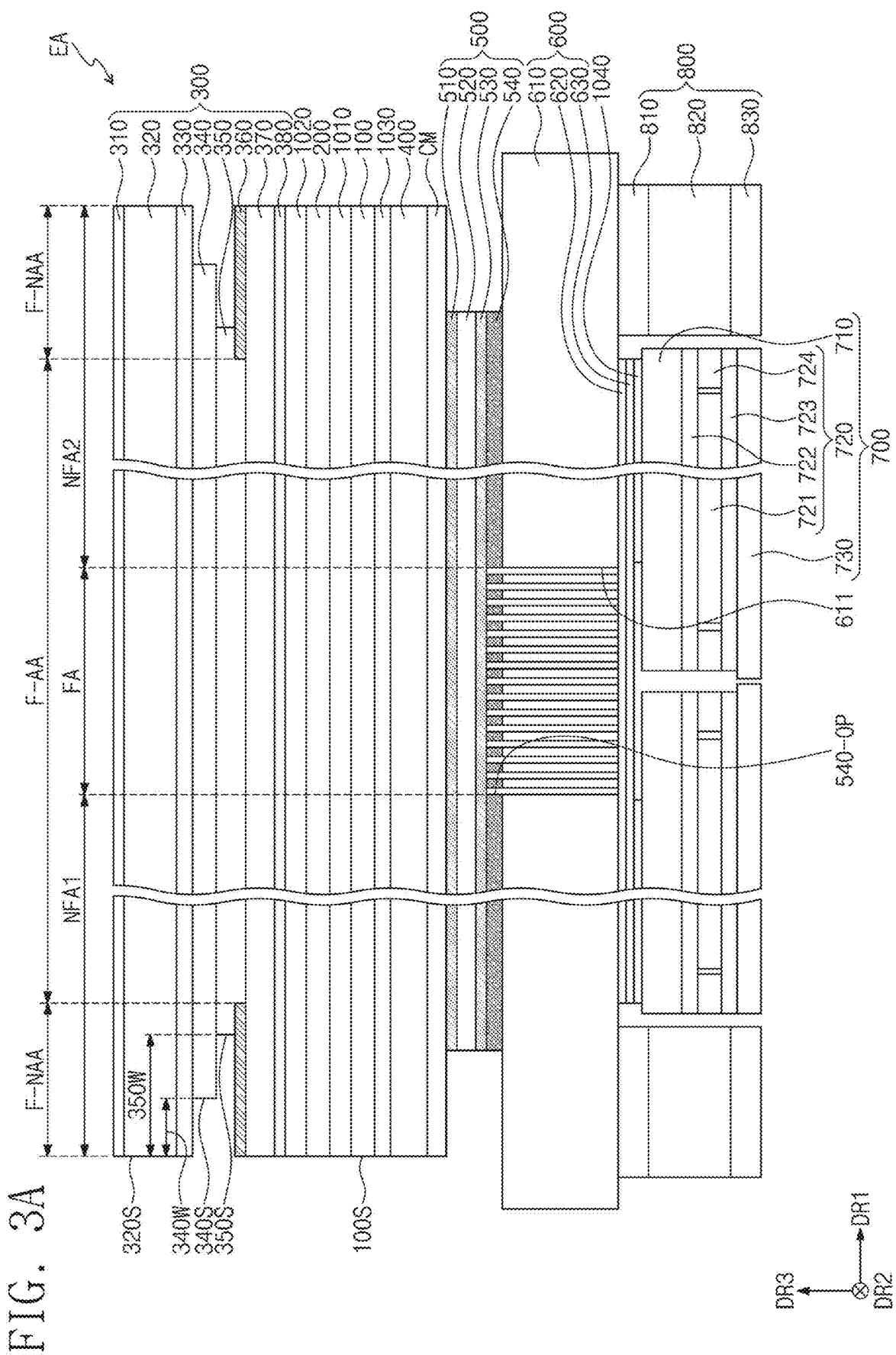
FIG. 3A is a cross-sectional view of an electronic apparatus according to an embodiment of the invention.
Figure 3C:
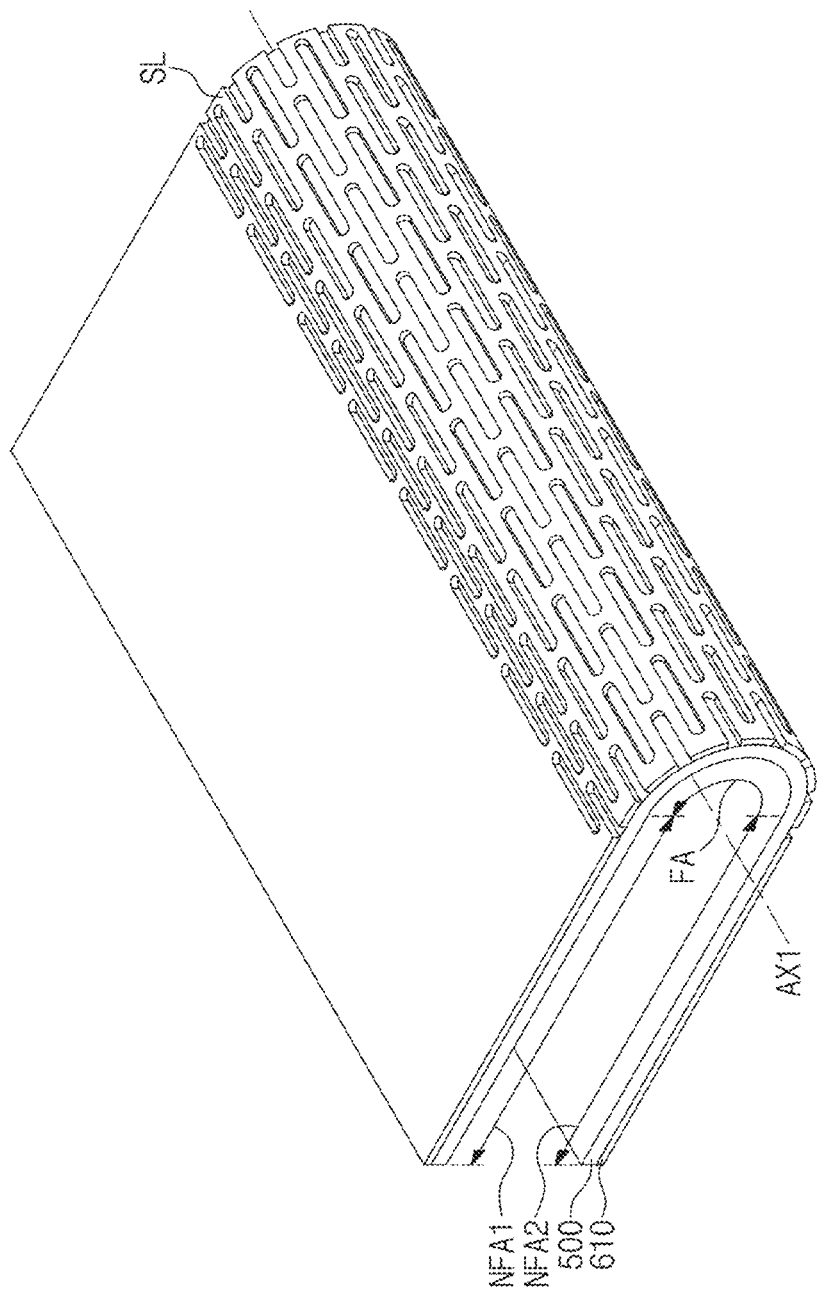
FIG. 3C is a perspective view illustrating an upper plate and a detection sensor in a folded state according to an embodiment of the invention.

FIG. 3A is a cross-sectional view of an electronic apparatus according to an embodiment of the invention. FIG. 3B is a plan view of an upper plate according to an embodiment of the invention. FIG. 3C is a perspective view illustrating an upper plate and a detection sensor in a folded state according to an embodiment of the invention.

Referring to FIG. 3A, an embodiment of the electronic apparatus EA according to the invention may include a display panel 100, a detection sensor 500, upper functional layers, and lower functional layers. The upper functional layers may be disposed on the display panel 100. In one embodiment, for example, the upper functional layers may include an anti-reflection member 200 and an upper member 300.

The display panel 100 is disposed between the upper member 300 and the lower member 600. In an embodiment, as described above, the display layer 110 may be included in the display panel 100 to function as a display device for displaying images, and the sensor layer 120 may be included in the display panel 100 to function as an input device for detecting external inputs.

An anti-reflection member 200 is disposed on the display panel 100. The anti-reflection member 200 may reduce reflectance of external light incident from the outside. The anti-reflection member 200 may include a stretched synthetic resin film. In one embodiment, for example, the anti-reflection member 200 may be provided by dyeing an iodine compound on a polyvinyl alcohol film ("PVA" film), but not being limited thereto. Alternatively, materials forming the anti-reflection member 200 may be variously changed or modified.

The anti-reflection member 200 may be bonded to the display panel 100 through a first adhesive layer 1010. The first adhesive layer 1010 may be a transparent adhesive layer such as a pressure sensitive adhesive film ("PSA"), an optically clear adhesive film ("OCA"), or an optically clear adhesive resin ("OCR"). An adhesive layer, which will be described later in detail, may include a conventional adhesive or a gluing agent.

In an alternative embodiment of the invention, the first adhesive layer 1010 may be omitted. In such an embodiment, the anti-reflection member 200 may be disposed directly on the display panel 100. In such an embodiment, a separate adhesive layer may not be disposed between the anti-reflection member 200 and the display panel 100.

The upper member 300 may be disposed on the anti-reflection member 200. The upper member 300 may include a first hard coating layer 310, a protective layer 320, a first upper adhesive layer 330, a window 340, a second upper adhesive layer 350, a light blocking layer 360, a shock absorbing layer 370, and a second hard coating layer 380. Components included in the upper member 300 are not limited to the components described above. In an alternative embodiment, at least some of the components described above may be omitted, or another component may be added.

The first hard coating layer 310 may be a layer disposed in or defining an outermost surface of the electronic apparatus EA. The first hard coating layer 310 may be a functional layer for improving usage properties of the electronic apparatus EA, and may be provided by being coated on the protective layer 320. In one embodiment, for example, the first hard coating layer 310 may enhance anti-fingerprint, anti-pollution, and scratch-resistant properties.

The protective layer 320 may be disposed below the first hard coating layer 310. The protective layer 320 may protect components disposed below the protective layer 320. The protective layer 320 may be additionally provided with the first hard coating layer 310 and an anti-fingerprint layer to improve properties such as chemical resistance and abrasion resistance. The protective layer 320 may include a film having an elastic modulus of about 15 gigapascals (GPa) or less at a room temperature. In an embodiment, the protective layer 320 may be omitted.

The first upper adhesive layer 330 may be disposed below the protective layer 320. The protective layer 320 and the window 340 may be bonded to each other through the first upper adhesive layer 330.

The window 340 may be disposed below the first upper adhesive layer 330. The window 340 may include an optically transparent insulating material. In one embodiment, for example, the window 340 may include a glass substrate or a synthetic resin film.

In an embodiment, where the window 340 is a synthetic resin film, the window 340 may include a polyimide ("PI") film or a polyethylene terephthalate ("PET") film.

The window 340 may have a multi-layer structure or a single-layer structure. In one embodiment, for example, the window 340 may include a plurality of synthetic resin films bonded through an adhesive, or a glass substrate and a synthetic resin film, which are bonded through an adhesive. The second upper adhesive layer 350 may be disposed below the window 340. The window 340 and the shock absorbing layer 370 may be bonded to each other through the second upper adhesive layer 350.

In an embodiment of the invention, a sidewall 340S of the window 340 and a sidewall 350S of the second upper adhesive layer 350 may be disposed inwards from the position of sidewalls of other layers, for example, a sidewall 100S of the display panel 100 and a sidewall 320S of the protective layer 320 (see 340W and 350W in FIG. 3A). Herein, being disposed inwards may indicate being closer to an active area than other comparison objects.

The folding operation of the electronic apparatus EA may change the positional relationship among respective layers. According to an embodiment of the invention, the sidewall 340S of the window 340 is disposed inwards from the sidewall 100S of the display panel 100 and the sidewall 320S of the protective layer 320, and thus even when the positional relationship among respective layers changes, the chances of the sidewall 340S of the window 340 protruding greater than the sidewall 320S of the protective layer 320 may be reduced. Accordingly, the chances of external impacts being delivered through the sidewall 340S of the window 340 may be reduced. As a result, the chances of the window 340 having cracks may be reduced.

The window 340 and the second upper adhesive layer 350 may be bonded to the shock absorbing layer 370 through a lamination process. In such an embodiment, areas of the window 340 and the second upper adhesive layer 350 may be smaller than an area of the shock absorbing layer 370, considering lamination process tolerance. In an embodiment, an area of the second upper adhesive layer 350 may be smaller than an area of the window 340.

When the first upper adhesive layer 330 and the second upper adhesive layer 350 are attached, the window 340 may fail to be slipped in the folding operation of the electronic apparatus EA, and buckling may thus be caused in the window 340. According to an embodiment of the invention, the area of the second upper adhesive layer 350 is smaller than the area of the window 340. Accordingly, the first upper adhesive layer 330 may not be attached to the second upper adhesive layer 350, and the chances of foreign matters sticking to the second upper adhesive layer 350 may thus be reduced.

The shock absorbing layer 370 may be a functional layer for protecting the display panel 100 from external impacts. The shock absorbing layer 370 may be selected from films having an elastic modulus of about 1 GPa or greater at a room temperature. The shock absorbing layer 370 may be a stretched film including an optical function. In one embodiment, for example, the shock absorbing layer 370 may be an optical axis control film. In one embodiment, for example, the shock absorbing layer 370 may be a biaxially stretched PET film.

The second hard coating layer 380 may be provided on a surface of the shock absorbing layer 370. The second hard coating layer 380 may include a material capable of reducing haze such as an organic coating agent, an inorganic coating agent, or an organic/inorganic mixed coating agent, but not being limited thereto.

Upper and lower surfaces of the shock absorbing layer 370 may include curved surfaces. The upper surface of the shock absorbing layer 370 may be in contact with the second upper adhesive layer 350. Accordingly, the curved upper surface of the shock absorbing layer 370 may be filled through the second upper adhesive layer 350. Therefore, optical issues (e.g., an increase in haze) may not be caused on the upper surface of the shock absorbing layer 370.

The light blocking layer 360 may be provide by being printed on the upper surface of the shock absorbing layer 370. The light blocking layer 360 may be disposed between the shock absorbing layer 370 and the second upper adhesive layer 350. The light blocking layer 360 may overlap the first peripheral area F-NAA. The light blocking layer 360 may be a colored layer and may be formed through a coating method. The light blocking layer 360 may include a polymer resin and a pigment mixed with a polymer resin. The polymer resin may be, for example, an acrylic-based resin or polyester, and the pigment may be a carbon-based pigment. However, the material forming the light blocking layer 360 is not limited thereto.

The upper member 300 may be bonded to the antireflection member 200 through a second adhesive layer 1020. The second adhesive layer 1020 may include a conventional adhesive or a gluing agent.

The lower functional layers may be disposed below the display panel 100. In one embodiment, for example, the lower functional layers may include a lower protective film 400, a cushion member CM, a lower member 600, a functional member 700, and a step compensation member 800. Components included in the lower functional layers are not limited to the components described above. Alternatively, at least some of the components described above may be omitted, or another component may be added.

The lower protective film 400 may be bonded to the rear surface of the display panel 100 through a third adhesive layer 1030. The lower protective film 400 may prevent scratches from being caused on the rear surface of the display panel 100 in the manufacturing process of the display panel 100. The lower protective film 400 may be a colored polyimide film. In one embodiment, for example, the lower protective film 400 may be an opaque yellow film, but is not limited thereto.

The cushion member CM may protect the display panel 100 from shocks transmitted from the lower portion of the display panel 100. The cushion member CM may include, for example, foam or a sponge. The foam may include polyurethane foam or thermoplastic polyurethane foam. In an embodiment where the cushion member CM includes the foam, the cushion member CM may further include a barrier film as a base layer, and the cushion member CM may be formed by applying a foaming agent onto the barrier film. In an embodiment, an adhesive layer (not shown) for bonding the lower protective film 400 and the cushion member CM may be further included.

The lower member 600 may be disposed below the display panel 100. The lower member 600 may include an upper plate 610, a lower adhesive layer 620, and a cover layer 630. Components included in the lower member 600 are not limited to the components described above. Alternatively, at least some of the components described above may be omitted, or another component may be added.

In an embodiment, the upper plate 610 may support components disposed on an upper portion. In such an embodiment, heat dissipation performance of the electronic apparatus EA may be improved through the upper plate 610. The upper plate 610 may include a material having an elastic modulus of about 60 GPa at a room temperature. In one embodiment, for example, the upper plate 610 may include stainless steel. The embodiment of the invention is not limited thereto, and alternatively, the upper plate 610 may include an aluminum alloy.

In an embodiment, a lower opening 611 may be defined in a portion of the upper plate 610 overlapping or corresponding to the folding area FA. The lower opening 611 may overlap the folding area FA and be defined through the upper plate 610. In one embodiment, for example, when viewed in the third direction DR3, the lower opening 611 may overlap the folding area FA.

Referring to FIGS. 3B and 3C, the portion of the upper plate 610 overlapping the folding area FA may have a slit SL structure. The slit SL structure refers to being connected to each other in the form of a net, and a lower opening 611 is defined between the slit SL. The lower opening 611 may be defined as an area between the slit SL.

According to an embodiment of the invention, when the electronic apparatus EA is in an in-folded state, an area of the lower opening 611 between the slit SL with respect to the first folding axis AX1 may increase or decrease according to the folding direction, and when the electronic apparatus EA is in a non-folded state, the area of the lower opening 611 between the slit SL with respect to the first folding axis AX1 may go back to an initial area before the increase or decrease. Accordingly, in such an embodiment, the display panel 100 is folded through the lower opening 611 defined in the slit SL, such that the shape of the upper plate 610 overlapping the folding area FA may be more easily deformed.

The cover layer 630 may be attached to the upper plate 610 through the lower adhesive layer 620. The lower adhesive layer 620 may include a conventional adhesive or a gluing agent. The cover layer 630 may cover the lower opening 611 of the upper plate 610. Accordingly, introduction of foreign substances into the lower opening 611 may be additionally prevented.

The functional member 700 may be disposed below the lower member 600. The functional member 700 may be provided in plural to be spaced apart from each other. In one embodiment, for example, one of the functional members 700 may be disposed to overlap the first non-folding area NFA1, and another of the functional members 700 may be disposed to overlap the second non-folding area NFA2.

The functional members 700 may each be attached to the lower member 600 through fourth adhesive layers 1040. In one embodiment, for example, one of the fourth adhesive layers 1040 is attached to a lower surface of the lower member 600 overlapping the first non-folding area NFA1, and another of the fourth adhesive layers 1040 is attached to a lower surface of the lower member 600 overlapping the second non-folding area NFA2. In such an embodiment, the fourth adhesive layers 1040 may not overlap the folding area FA and expose a portion of the cover layer 630.

The functional members 700 may each include a lower plate 710, a heat dissipation sheet 720, and an insulating film 730. Components included in the functional member 700 are not limited to the components described above. Alternatively, at least some of the components described above may be omitted, or another component may be added.

The lower plate 710 is provided in plural. One of the lower plates 710 may be disposed to overlap the first non-folding area NFA1 and a portion of the folding area FA, and another of the lower plates 710 may be disposed to overlap another portion of the folding area FA and the second non-folding area NFA2.

The lower plates 710 may be disposed to be spaced apart from each other in the folding area FA. In such an embodiment, the lower plates 710 may be disposed as close as possible to support an area in which the lower opening 611 of the upper plate 610 is formed. In one embodiment, for example, the lower plates 710 may prevent the shape of the area in which the lower opening 611 of the upper plate 610 is defined from being deformed due to pressure applied from the top.

In an embodiment, the lower plates 710 may serve to prevent the shape of the components disposed on the functional members 700 from being deformed due to the components disposed below the functional members 700.

The lower plates 710 may each include a metal alloy, and for example, the lower plates 710 may each include a copper alloy. However, the materials forming the lower plates 710 are not limited thereto.

The heat dissipation sheet 720 may be disposed or attached below the lower plate 710. The heat dissipation sheet 720 may be a heat conduction sheet having high thermal conductivity. In one embodiment, for example, the heat dissipation sheet 720 may include a heat dissipation layer 721, a first heat dissipation adhesive layer 722, a second heat dissipation adhesive layer 723, and a gap tape 724.

The gap tape 724 may be attached to the first heat dissipation adhesive layer 722 and the second heat dissipation adhesive layer 723, which are spaced apart from each other with the heat dissipation layer 721 therebetween. The gap tape 724 may have a multilayer structure including a plurality of layers. In one embodiment, for example, the gap tape 724 may include a base layer, an upper adhesive layer disposed on an upper surface of the base layer, and a lower adhesive layer disposed on a lower surface of the base layer.

The heat dissipation layer 721 may be attached to the lower plate 710 through the first heat dissipation adhesive layer 722. The heat dissipation layer 721 may be sealed through the first heat dissipation adhesive layer 722, the second heat dissipation adhesive layer 723, and the gap tape 724. The heat dissipation layer 721 may be a graphitized polymer film. The polymer film may be, for example, a polyimide film.

The insulating film 730 may be attached below the heat dissipation sheet 720. In one embodiment, for example, the insulating film 730 may be attached to the second heat dissipation adhesive layer 723. In such an embodiment, the insulating film 730 may effectively prevent rattle from being caused in an electronic apparatus EA. The thickness of the insulating film 730 may be about 15 micrometers ($\mu$m), but is not limited thereto.

The step compensation member 800 may be disposed or attached below the upper plate 610. In one embodiment, for example, the lower adhesive layer 620 may be attached below a portion of the upper plate 610, and the step compensation member 800 may be attached below another portion of the upper plate 610. The step compensation member 800 may include a first compensation adhesive layer 810, a step compensation film 820, and a second compensation adhesive layer 830. The first compensation adhesive layer 810 may be attached to the lower surface of the upper plate 610. The step compensation film 820 may be a synthetic resin film. The second compensation adhesive layer 830 may be attached to a lower surface of the step compensation film 820 and a set (not shown).

The detection sensor 500 may be disposed below the display panel 100. The detection sensor 500 may include a first sensor adhesive layer 510, a digitizer 520, a second sensor adhesive layer 530, and a shielding layer 540.

The first sensor adhesive layer 510 bonds the cushion member CM and the digitizer 520. The second sensor adhesive layer 530 bonds the digitizer 520 and the shielding layer 540. The adhesive layers 510 and 530 may be a transparent adhesive layer such as a PSA, an OCA, or an OCR.

The digitizer 520 may include a plurality of coils. The digitizer 520 may detect different types of external inputs from the sensor layer 120 of the display panel 100. In one embodiment, for example, the digitizer 520 may detect signals transmitted through the pen SP (see FIG. 1A) among external inputs.

The shielding layer 540 may be disposed between the digitizer 520 and the upper plate 610. The shielding layer 540 may prevent electrical interference between components disposed below the digitizer 520 and the digitizer 520. Accordingly, in such an embodiment, the digitizer 520 of an electronic apparatus EA may have improved reliability.

The shielding layer 540 may include a metal. In one embodiment, for example, the shielding layer 540 may include magnetic metal powder ("MMP"). However, materials of the shielding layer 540 are not limited thereto, and the shielding layer 540 may include at least one selected from permalloy or invar, which is an alloy of nickel (Ni) and iron (Fe), and stainless steel.

In an embodiment according to the invention, a shielding opening 540-OP overlapping the lower opening 611 may be defined in the shielding layer 540. The shielding opening 540-OP may be defined by a side surface of the shielding layer 540 overlapping the folding area FA and through the shielding layer 540. In one embodiment, for example, when viewed in the third direction DR3, the shielding opening 540-OP may overlap the folding area FA.

According to embodiments of the invention, even when the detection sensor 500 includes the shielding layer 540, the shape of the detection sensor 500 overlapping the folding area FA may be more easily deformed by the shielding opening 540-OP defined therein to overlap the lower opening 611.

Figure 4A:
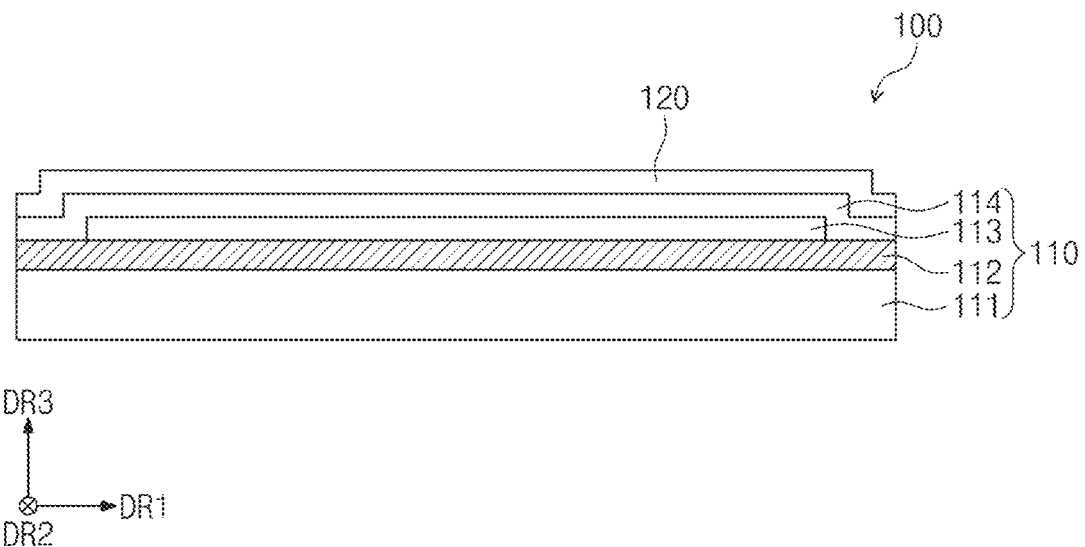
FIG. 4A is a cross-sectional view of a display panel according to an embodiment of the invention.
Figure 4B:
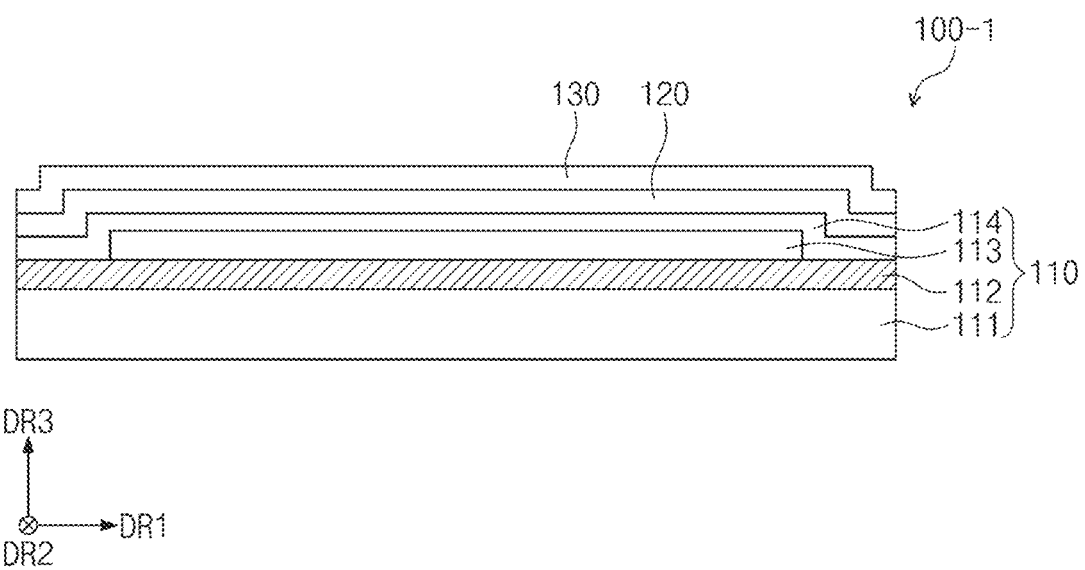
FIG. 4B is a cross-sectional view of a display panel according to an alternative embodiment of the invention.
Figure 5A:
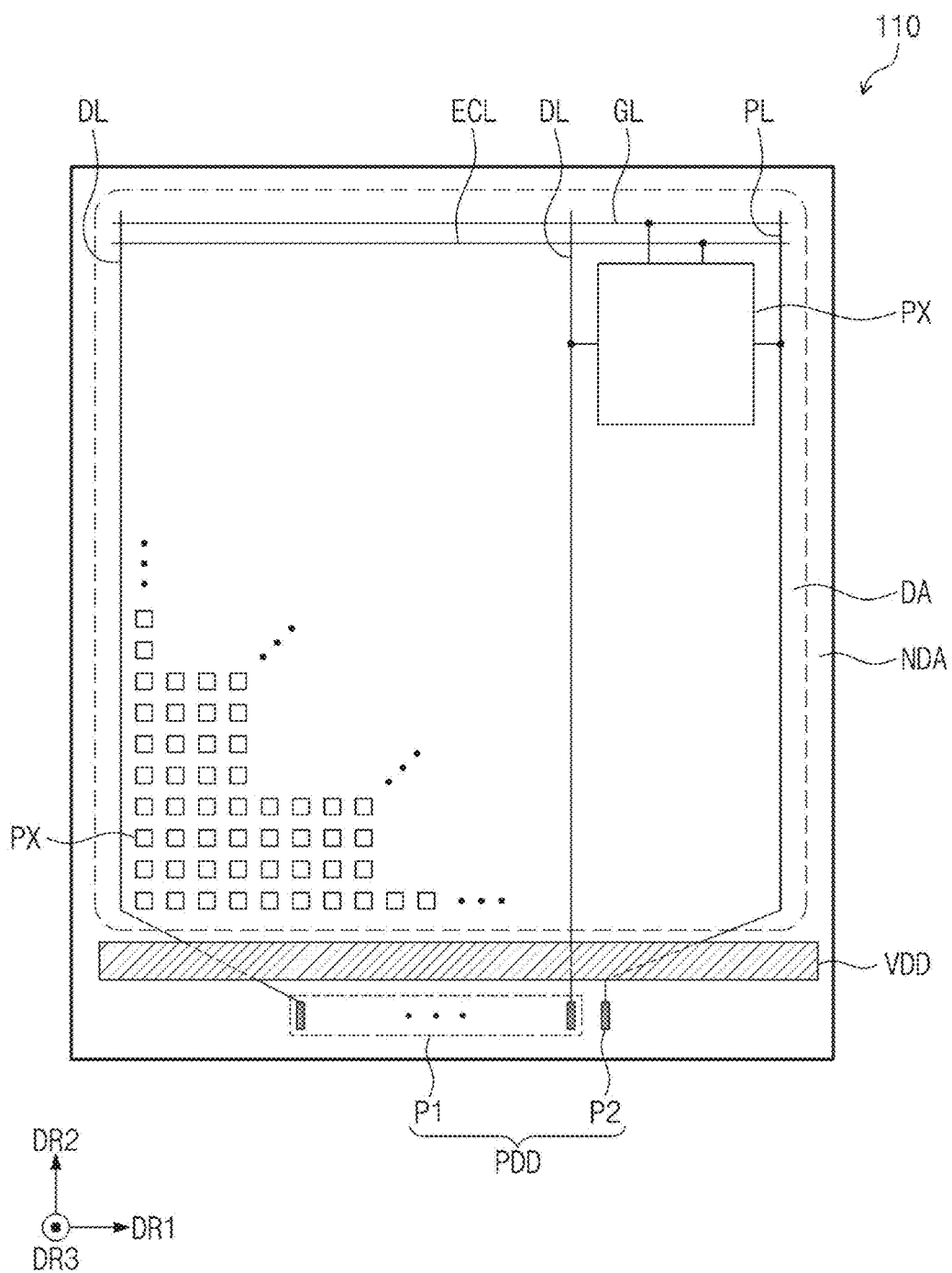
FIG. 5A is a plan view of a display layer according to an embodiment of the invention.
Figure 5B:
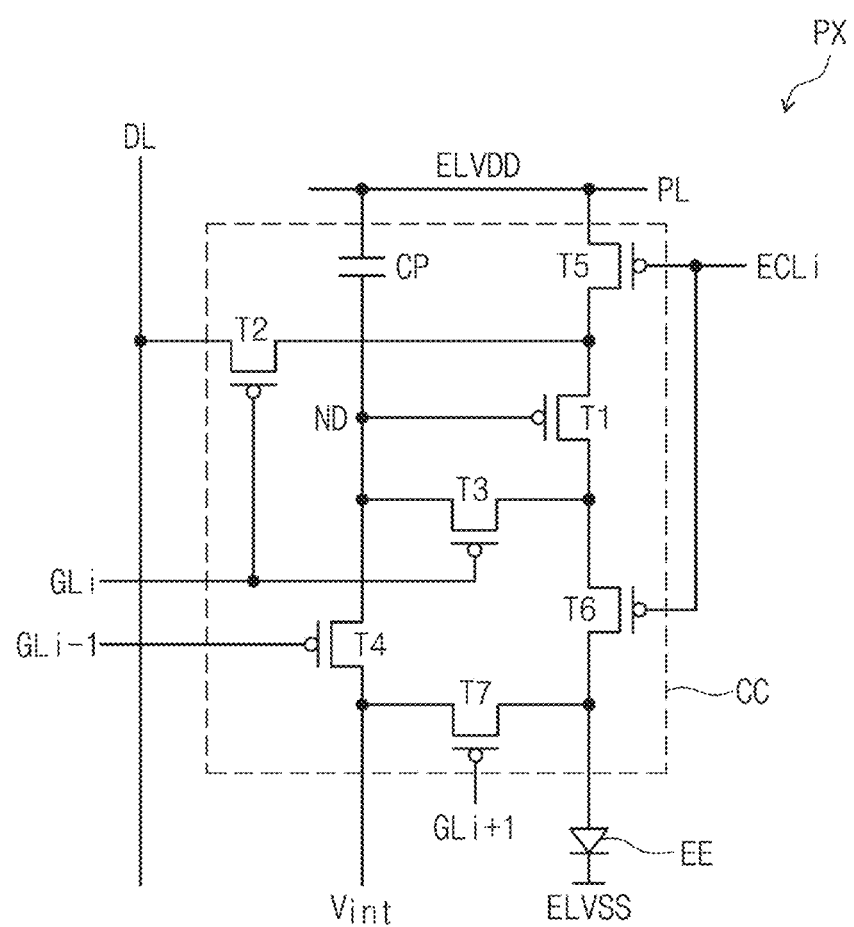
FIG. 5B is an equivalent circuit diagram of a pixel according to an embodiment of the invention.
Figure 6:
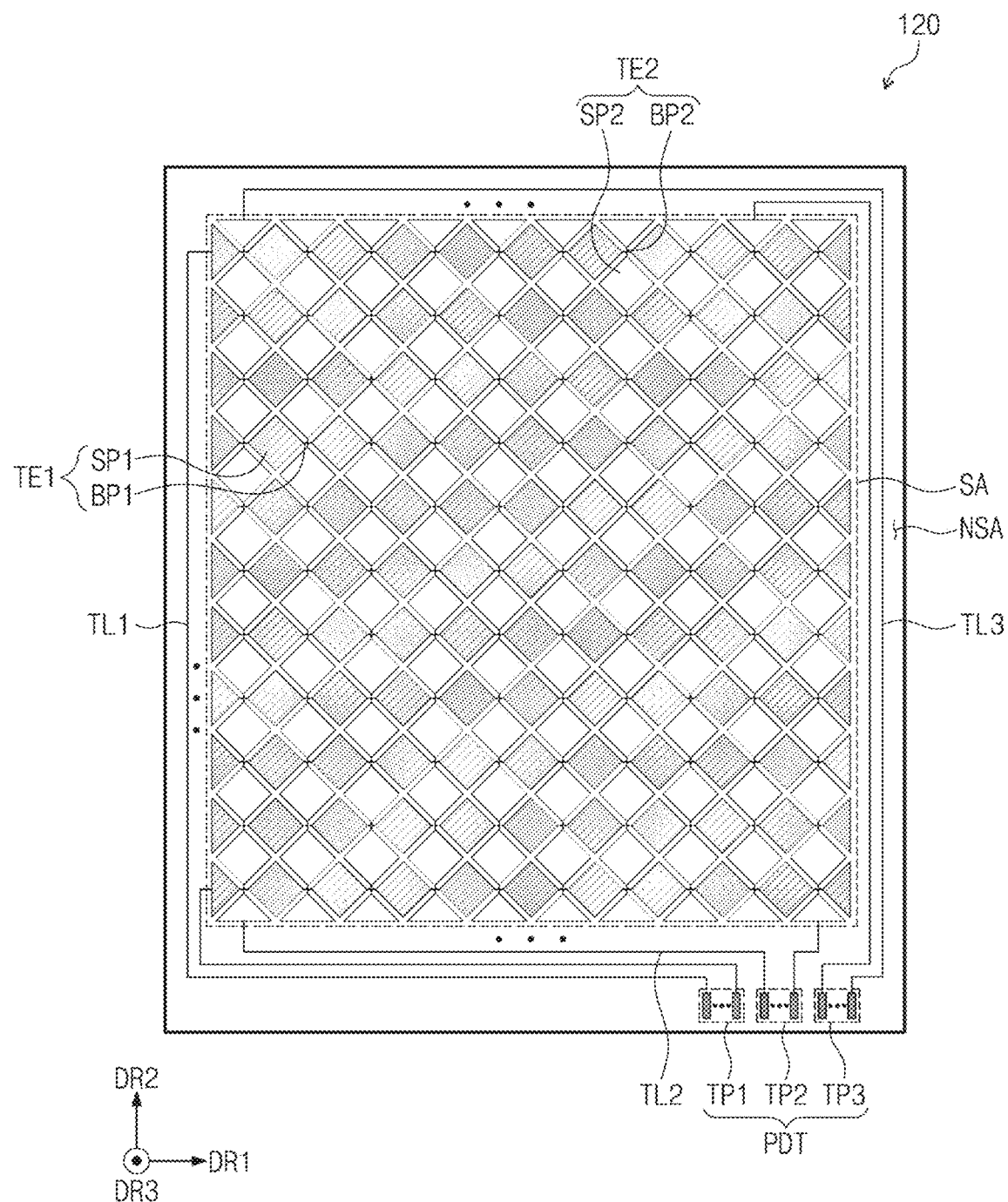
FIG. 6 is a plan view of a sensor layer according to an embodiment of the invention.
Figure 7:
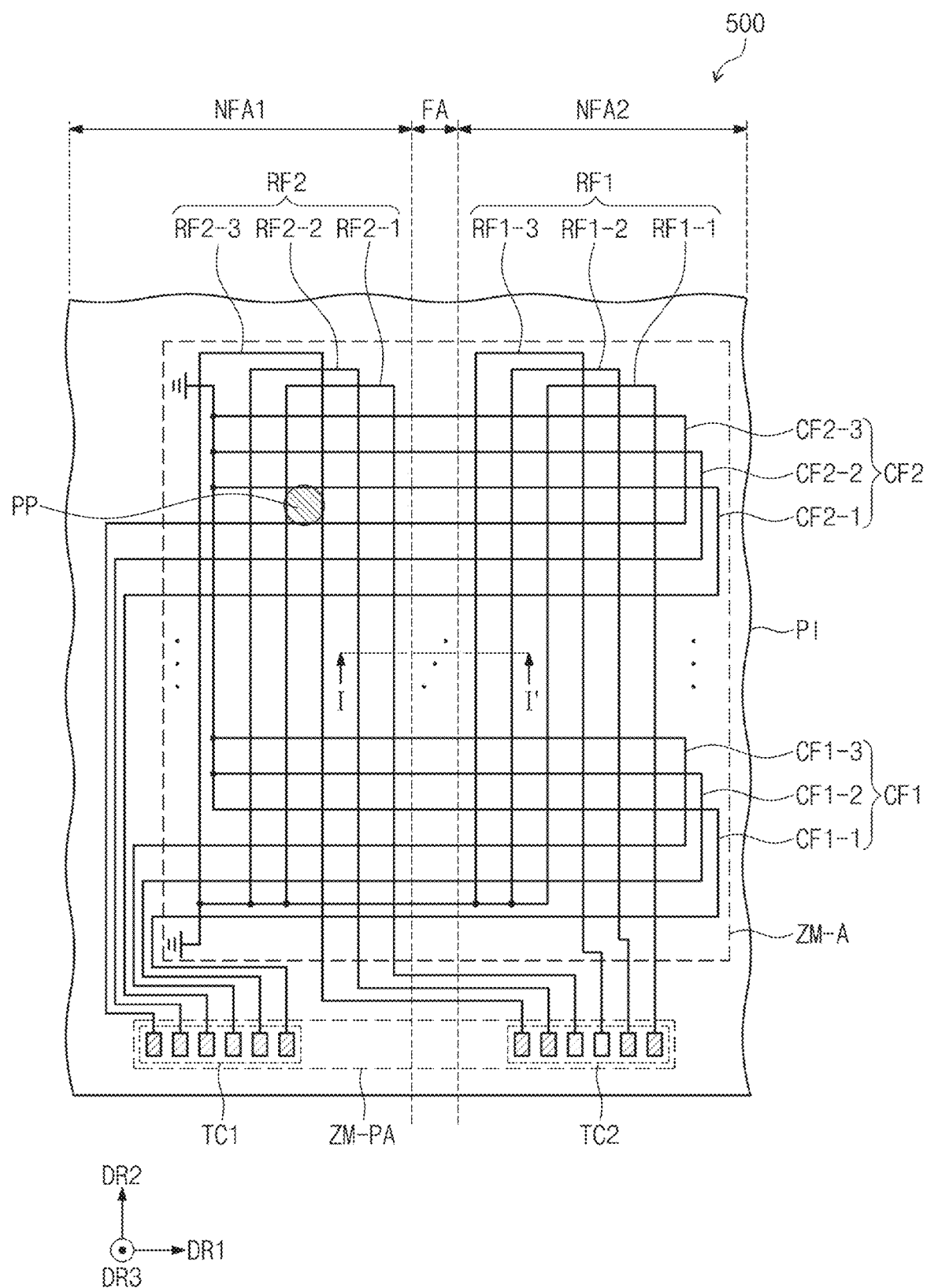
FIG. 7 is a plan view of a detection sensor according to an embodiment of the invention.
Figure 8:
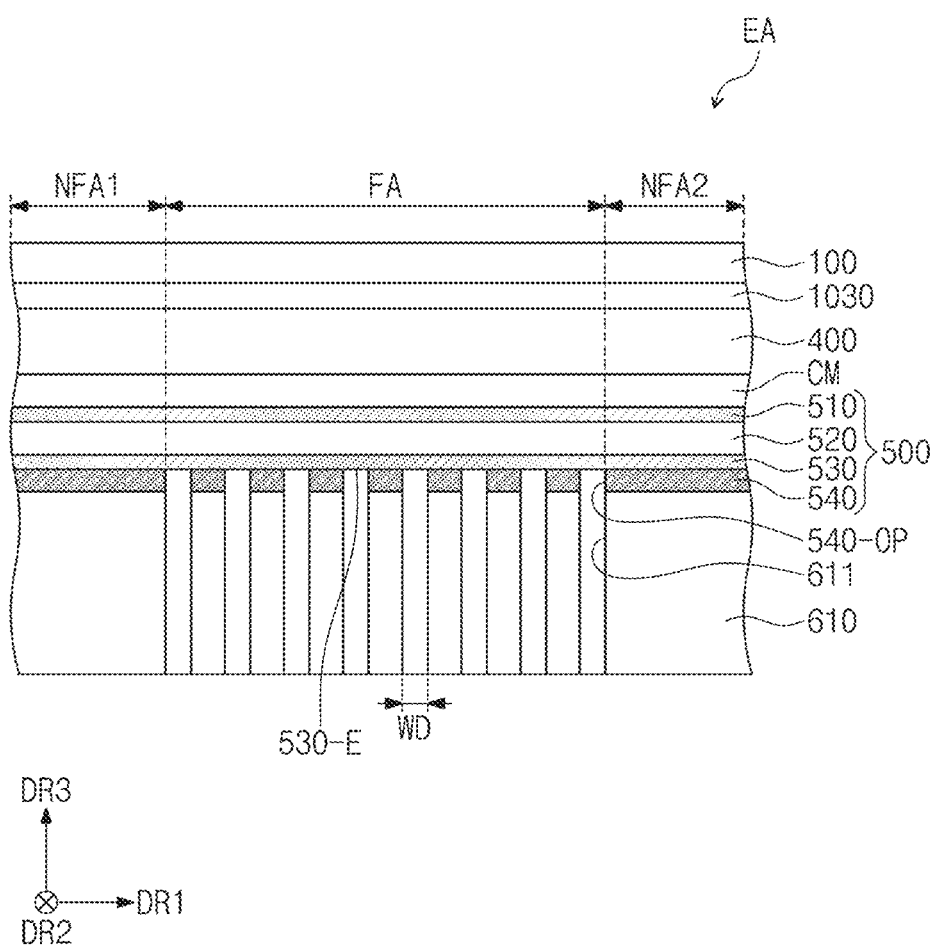
FIG. 8 is a cross-sectional view illustrating some components of an electronic apparatus overlapping a folding area according to an embodiment of the invention.

FIG. 4A is a cross-sectional view of a display panel according to an embodiment of the invention. FIG. 4B is a cross-sectional view of a display panel according to an alternative embodiment of the invention. FIG. 5A is a plan view of a display layer according to an embodiment of the invention. FIG. 5B is an equivalent circuit diagram of a pixel according to an embodiment of the invention. FIG. 6 is a plan view of a sensor layer according to an embodiment of the invention. FIG. 7 is a plan view of a detection sensor according to an embodiment of the invention. FIG. 8 is a cross-sectional view illustrating some components of an electronic apparatus overlapping a folding area according to an embodiment of the invention.

Referring to FIG. 4, an embodiment of the display panel 100 may be configured to generate images and detect external inputs applied from the outside. In one embodiment, for example, the display panel 100 may include a display layer 110 and a sensor layer 120.

The display layer 110 may be configured to substantially generate images. The display layer 110 may be a light emitting display layer, and for example, the display layer 110 may be an organic light emitting display layer, a quantum dot display layer, or a micro LED display layer.

The display layer 110 may include a base layer 111, a circuit layer 112, a light emitting element layer 113, and an encapsulation layer 114.

The base layer 111 may include a synthetic resin film. The synthetic resin film may include a thermosetting resin. The base layer 111 may have a multilayer structure. In one embodiment, for example, the base layer 111 may have a three-layer structure of a synthetic resin layer, an adhesive layer, and a synthetic resin layer.

In an embodiment, the synthetic resin layer may be a polyimide-based resin layer, but the material thereof is not particularly limited. The synthetic resin layer may include at least one selected from an acrylic-based resin, a methacrylate-based resin, polyisoprene, a vinyl-based resin, an epoxy-based resin, a urethane-based resin, a cellulose-based resin, a siloxane-based resin, a polyamide-based resin, and a perylene-based resin. In an embodiment, the base layer 111 may include a glass substrate or an organic/inorganic composite material substrate.

The circuit layer 112 may be disposed on the base layer 111. The circuit layer 112 may include an insulating layer, a semiconductor pattern, a conductive pattern, and a signal line. The insulating layer, the semiconductor layer, and the conductive layer are formed on the base layer 111 through methods such as coating or vapor deposition, and then the insulating layer, the semiconductor layer, and the conductive layer may be selectively patterned by a plurality of photolithography processes. Thereafter, a semiconductor pattern, a conductive pattern, and a signal line included in the circuit layer 112 may be formed.

The light emitting element layer 113 may be disposed on the circuit layer 112. The light emitting element layer 113 may include light emitting elements. In one embodiment, for example, the light emitting element layer 113 may include organic light emitting materials, quantum dots, quantum rods, or micro light emitting diodes ("LED"s).

The encapsulation layer 114 may be disposed on the light emitting element layer 113. The encapsulation layer 114 may include an inorganic layer, an organic layer, and an inorganic layer that are sequentially stacked one on another, but the layers of the encapsulation layer 114 are not limited thereto.

The inorganic layers of the encapsulation layer 114 may protect the light emitting element layer 113 from moisture and oxygen, and the organic layer of the encapsulation layer 114 may protect the light emitting element layer 113 from foreign substances such as dust particles. The inorganic layers of the encapsulation layer 114 may include at least one selected from a silicon nitride layer, a silicon oxy nitride layer, a silicon oxide layer, a titanium oxide layer, and an aluminum oxide layer. The organic layer of the encapsulation layer 114 may include an acrylic-based organic layer, but is not limited thereto.

The sensor layer 120 may be disposed on the display layer 110. The sensor layer 120 may detect external inputs applied from the outside. The external inputs may include various forms of inputs provided from outside the electronic apparatus EA. In one embodiment, for example, the external inputs may include external inputs applied when approaching the electronic apparatus EA (see FIG. 2) or being adjacent by a predetermined distance (e.g., hovering), as well as contact by a part of a body such as a user's hand. In an embodiment, the external inputs may have various forms such as force, pressure, temperature, light, etc., and are not limited thereto.

In an embodiment, the sensor layer 120 may be provided or formed on the display layer 110 through a continuous process. In such an embodiment, the sensor layer 120 may be indicated as being disposed directly on the display layer 110 such that a third component is not disposed between the sensor layer 120 and the display layer 110. In such an embodiment, a separate adhesive member may not be disposed between the sensor layer 120 and the display layer 110.

Alternatively, the sensor layer 120 may be bonded to the display layer 110 through an adhesive member. The adhesive member may include a conventional adhesive or a gluing agent.

Referring to FIG. 4B, an embodiment of a display panel 100-1 may further include an anti-reflection layer 130 as compared to the display panel 100 described in FIG. 4A. In such an embodiment, the anti-reflection member 200 (see FIG. 3A) and the third adhesive layer 1030 (see FIG. 3A) may be omitted from the electronic apparatus EA (see FIG. 2) including the display panel 100-1. Hereinafter, any repetitive detailed descriptions of the same or like elements as those of the display panel 100 described in FIG. 4A will be omitted or simplified.

An embodiment of the display panel 100-1 may include a display layer 110, a sensor layer 120, and an anti-reflection layer 130.

In an embodiment, the anti-reflection layer 130 may include color filters. The color filters may have a predetermined arrangement. The arrangement of color filters may be determined in consideration of emission colors of pixels included in the display layer 110. In such an embodiment, the anti-reflection layer 130 may further include a black matrix adjacent to the color filters.

In an embodiment, the anti-reflection layer 130 may include a destructive interference structure. In one embodiment, for example, the destructive interference structure may include a first reflection layer and a second reflection layer which are disposed in different layers from each other. First reflection light and second reflection light, which are respectively reflected by the first reflection layer and the second reflection layer, may destructively interfere with each other, thereby reducing reflectance of external light.

Referring to FIG. 5A, an embodiment of the display layer 110 may include a plurality of pixels PX, a plurality of signal lines GL, DL, PL, and ECL, and a plurality of display pads PDD. A display area DA of the display layer 110 is an area for displaying an image IM, and a non-display area NDA may be an area in which a driving circuit or a driving line is disposed. The display area DA may overlap at least a portion of the active areas F-AA and R-AA (see FIGS. 1B and 1C) of the electronic apparatus EA. In such an embodiment, the non-display area NDA may overlap the peripheral areas F-NAA and R-NAA (see FIGS. 1B and 1C) of the electronic apparatus EA.

The plurality of signal lines GL, DL, PL, and ECL may be connected to the pixels PX to transmit electrical signals to the pixels PX. In FIG. 5A, a scan line GL, a data line DL, a power line PL, and a light emitting control line ECL among the signal lines included in the display panel 100 are illustrated, but not being limited thereto. Alternatively, the signal lines GL, DL, PL, and ECL may further include an initialization voltage line, for example.

The pixels PX may be arranged to be spaced apart from each other along the first direction DR1 and the second direction DR2 in a matrix form on a plane.

Referring to FIG. 5B, a schematic signal circuit diagram of an embodiment of one pixel PX among the plurality of pixels is illustrated. FIG. 5B illustrates, an embodiment of a pixel PX connected to a i-th scan line GLi and a i-th light emitting control line ECLi.

The pixel PX may include a light emitting element EE and a pixel circuit CC. The pixel circuit CC may include a plurality of transistors T1 to T7 and a capacitor CP. The plurality of transistors T1 to T7 may be formed through a low temperature polycrystalline silicon ("LTPS") process or a low temperature polycrystalline oxide ("LTPO") process.

The pixel circuit CC controls the amount of current flowing through the light emitting element EE in response to data signals. The light emitting element EE may emit light with a predetermined luminance in response to the amount of current provided from the pixel circuit CC. In such an embodiment, the level of a first power ELVDD may be set higher than the level of a second power ELVSS. The light emitting element EE may include an organic light emitting element or a quantum dot light emitting element.

The plurality of transistors T1 to T7 may each include an input electrode (or a source electrode), an output electrode (or a drain electrode), and a control electrode (or a gate electrode). Herein, for convenience of description, one of the input electrode and the output electrode may be referred to as a first electrode, and the other of the input electrode and the output electrode may be referred to as a second electrode.

The first electrode of the first transistor T1 is connected to the first power ELVDD via the fifth transistor T5, and the second electrode of the first transistor T1 is connected to an anode electrode of the light emitting element EE via the sixth transistor T6. Herein, the first transistor T1 may be referred to as a driving transistor.

The first transistor T1 controls the amount of current flowing through the light emitting element EE in response to a voltage applied to the control electrode of the first transistor T1.

The second transistor T2 is connected between the data line DL and the first electrode of the first transistor T1. In addition, the control electrode of the second transistor T2 is connected to the i-th scan line GLi. The second transistor T2 is turned on when an i-th scan signal is provided to the i-th scan line GLi to electrically connect the data line DL with the first electrode of the first transistor T1.

The third transistor T3 is connected between the second electrode of the first transistor T1 and the control electrode of the first transistor T1. The control electrode of the third transistor T3 is connected to the i-th scan line GLi. The third transistor T3 is turned on when an i-th scan signal is provided to the i-th scan line GLi to electrically connect the second electrode of the first transistor T1 with the control electrode of the first transistor T1. Accordingly, when the third transistor T3 is turned on, the first transistor T1 is connected in the form of a diode.

The fourth transistor T4 is connected between a node ND and an initialization power generation unit (not shown). In addition, the control electrode of the fourth transistor T4 is connected to an (i−1)-th scan line GLi−1. The fourth transistor T4 is turned on when an (i−1)-th scan signal is provided to the (i−1)-th scan line GLi−1 to provide an initialization voltage Vint to the node ND.

The fifth transistor T5 is connected between the power line PL and the first electrode of the first transistor T1. The control electrode of the fifth transistor T5 is connected to the i-th light emitting control line ECLi.

The sixth transistor T6 is connected between the second electrode of the first transistor T1 and the anode electrode of the light emitting element EE. In addition, the control electrode of the sixth transistor T6 is connected to the i-th light emitting control line ECLi.

The seventh transistor T7 is connected between the initialization power generation unit (not shown) and the anode electrode of the light emitting element EE. In addition, the control electrode of the seventh transistor T7 is connected to an (i+1)-th scan line GLi+1. The seventh transistor T7 is turned on when an (i+1)-th scan signal is provided to the (i+1)-th scan line GLi+1 to provide the initialization voltage Vint to the anode electrode of the light emitting element EE.

The seventh transistor T7 may improve black-displaying capability of the pixel PX. In such an embodiment, when the seventh transistor T7 is turned on, a parasitic capacitor (not shown) of the light emitting element EE is discharged. Then, when black luminance is implemented, the light emitting element EE does not emit light due to a leakage current from the first transistor T1, and accordingly, the black-displaying capability may be improved.

In an embodiment, as illustrated in FIG. 5B, the control electrode of the seventh transistor T7 may be connected to the (i+1)-th scan line GLi+1, but the embodiment of the invention is not limited thereto. In an alternative embodiment of the invention, the control electrode of the seventh transistor T7 may be connected to the i-th scan line GLi or the (i−1)-th scan line GLi−1.

The capacitor CP is disposed between the power line PL and the node ND. The capacitor CP stores a voltage corresponding to a data signal. When the fifth transistor T5 and the sixth transistor T6 are turned on according to the voltages stored in the capacitor CP, the amount of current flowing through the first transistor T1 may be determined.

In embodiments of the invention, an equivalent circuit of the pixel PX is not limited to the equivalent circuit shown in FIG. 5B. In an alternative embodiment of the invention, the pixel PX may be implemented in various forms to emit light of the light emitting element EE. FIG. 5B shows an embodiment where the transistors T1 to T7 are P-type metal-oxide-silicon ("PMOS") transistor, but the embodiment of the invention is not limited thereto. In an alternative embodiment of the invention, transistors in the pixel circuit CC may be N-type metal-oxide-silicon ("NMOS") transistors. In another alternative embodiment of the invention, the pixel circuit CC may be configured through a combination of NMOS transistors and PMOS transistors.

Referring back to FIG. 5A, a power pattern VDD is disposed in the non-display area NDA. In an embodiment, the power pattern VDD is connected to a plurality of power lines PL. Accordingly, the display layer 110 includes the power pattern VDD, and may thus provide identical first power signals to the plurality of pixels PX.

The display pads PDD may include a first pad P1 and a second pad P2. The first pad P1 may be provided in plural and may each be connected to the data lines DL. The second pad P2 may be connected to the power pattern VDD to be electrically connected to the power line PL. The display layer 110 may provide electrical signals provided from the outside through the display pads PDD to the pixels PX. In an embodiment, the display pads PDD may further include pads for receiving other electrical signals in addition to the first pad P1 and the second pad P2, but not being limited thereto.

Referring to FIG. 6, the sensor layer 120 may be disposed on the display layer 110. The sensor layer 120 may be bonded to the display layer 110 through a separate adhesive layer. However, the embodiment of the invention is not limited thereto, and alternatively, the sensor layer 120 may be formed directly on the display layer 110 through a continuous process, but not being limited thereto.

The sensor layer 120 may include a first sensing electrode TE1, a second sensing electrode TE2, a plurality of trace lines TL1, TL2, and TL3, and a plurality of sensing pads PDT (e.g., first to third pads TP1 TP2, and TP3). In an embodiment, a sensing area SA and a non-sensing area NSA may be defined in the sensor layer 120. The non-sensing area NSA may surround the sensing area SA. The sensing area SA may be a sensing area for detecting inputs applied from the outside. The sensing area SA may overlap the display area DA of the display layer 110.

The sensor layer 120 may detect external inputs through any one of a self-capacitance type or a mutual capacitance type. The first sensing electrode TE1 and the second sensing electrode TE2 may be variously modified according to types to be arranged and connected.

The first sensing electrode TE1 may include first sensing patterns SP1 and first bridge patterns BP1. The first sensing electrode TE1 may extend along the first direction DR1 and be arranged along the second direction DR2. The first sensing patterns SP1 may be arranged to be spaced apart along the first direction DR1. At least one first bridge pattern BP1 may be disposed between two first sensing patterns SP1 adjacent to each other.

The second sensing electrode TE2 may include second sensing patterns SP2 and second bridge patterns BP2. The second sensing electrode TE2 may extend along the second direction DR2 and be arranged along the first direction DR1. The second sensing patterns SP2 may be arranged to be spaced apart along the second direction DR2. At least one second bridge pattern BP2 may be disposed between two second sensing patterns SP2 adjacent to each other.

The trace lines TL1, TL2, and TL3 are disposed in the non-sensing area NSA. The trace lines TL1, TL2, and TL3 may include a first trace line TL1, a second trace line TL2, and a third trace line TL3.

The first trace line TL1 is connected to one end of the first sensing electrode TE1. The second trace line TL2 is connected to one end of the second sensing electrode TE2. The third trace line TL3 is connected to the other end of the second sensing electrode TE2. The other end of the second sensing electrode TE2 may be a portion facing the one end of the second sensing electrode TE2.

According to an embodiment of the invention, the second sensing electrode TE2 may be connected to the second trace line TL2 and the third trace line TL3. Accordingly, sensitivity according to areas may be uniformly maintained for the second sensing electrode TE2 having a relatively longer length than the first sensing electrodes TE1. Alternatively, the third trace line TL3 may be omitted.

The sensing pads PDT are disposed in the non-sensing area NSA. The sensing pads PDT may include a first sensing pad TP1, a second sensing pad TP2, and a third sensing pad TP3. The first sensing pad TP1 is connected to the first trace line TL1 to be electrically connected to the first sensing electrode TE1. The second sensing pad TP2 is connected to the second trace line TL2, and the third sensing pad TP3 is connected to the third trace line TL3. Accordingly, the second sensing pad TP2 and the third sensing pad TP3 are electrically connected to the corresponding second sensing electrode TE2.

Referring to FIG. 7, the detection sensor 500 may detect external inputs through an EMR method. The detection sensor 500 may include a base layer PI, digitizer sensors CF1, CF2, RF1, and RF2 on a sensing area ZM-A of the base layer PI, and a plurality of digitizer pads TC1 and TC2 on a pad area ZM-PA of the base layer PI.

The base layer PI may be a base layer in which the digitizer sensors CF1, CF2, RF1, and RF2 are disposed. The base layer PI may include organic materials. In one embodiment, for example, the base layer PI may include PI. The base layer PI may be provided as a plurality of layers including a first cover layer PI1 and a second cover layer PI2 (see FIG. 11), or may be provided as a single layer, as described later.

The first digitizer sensors CF1, and CF2 may each include a plurality of first sensing coils, CF1-1, CF1-2, CF1-3, CF2-1, CF2-2, and CF2-3, and the second digitizer sensors RF1 and RF2 may each include a plurality of second sensing coils RF1-1, RF1-2, RF1-3, RF2-1, RF2-2, and RF2-3.

The first sensing coils CF1-1, CF1-2, CF1-3, CF2-1, CF2-2, and CF2-3 may extend in the first direction DR1. The first sensing coils CF1-1, CF1-2, CF1-3, CF2-1, CF2-2, and CF2-3 may be arranged to be spaced apart from one another along the second direction DR2.

The second sensing coils RF1-1, RF1-2, RF1-3, RF2-1, RF2-2, and RF2-3 may extend in the second direction DR2. The second sensing coils RF1-1, RF1-2, RF1-3, RF2-1, RF2-2, and RF2-3 may be arranged to be spaced apart from one another along the first direction DR1.

In an embodiment, the second sensing coils RF1-1, RF1-2, RF1-3, RF2-1, RF2-2, and RF2-3 may extend in the second direction DR2 which is the same direction as imaginary folding axes AX1 and AX2 (see FIGS. 1B and 1D).

The first digitizer sensors CF1 and CF2 correspond to input coils of the electromagnetic resonance type detection sensor 500, and the second digitizer sensors RF1 and RF2 correspond to output coils of the electromagnetic resonance type detection sensor 500.

The first sensing coils CF1-1, CF1-2, CF1-3, CF2-1, CF2-2, and CF2-3 and the second sensing coils RF1-1, RF1-2, RF1-3, RF2-1, RF2-2, and RF2-3 may be disposed to be insulated from one another on the base layer PI. The first sensing coils CF1-1, CF1-2, CF1-3, CF2-1, CF2-2, and CF2-3 each are connected to the corresponding first digitizer pads TC1, and the second sensing coils RF1-1, RF1-2, RF1-3, RF2-1, RF2-2, and RF2-3 each are connected to the corresponding second digitizer pads TC2.

The first sensing coils CF1-1, CF1-2, CF1-3, CF2-1, CF2-2, and CF2-3 each receive scan signals activated in different sections or timings. The first sensing coils CF1-1, CF1-2, CF1-3, CF2-1, CF2-2, and CF2-3 each generate a magnetic field in response to the corresponding scan signals.

When the pen SP (see FIG. 1A) is adjacent to the first sensing coils CF1-1, CF1-2, CF1-3, CF2-1, CF2-2, and CF2-3, the magnetic field induced from the first sensing coils CF1-1, CF1-2, CF1-3, CF2-1, CF2-2, and CF2-3 resonates with the resonance circuit of the pen SP, and the pen SP generates resonant frequencies. In an embodiment, the pen SP may be a pen SP having an LC resonance circuit including an inductor and a capacitor.

The second sensing coils RF1-1, RF1-2, RF1-3, RF2-1, RF2-2, and RF2-3 output sensing signals corresponding to the resonant frequencies of an input means to the second digitizer pads TC2.

The center of an area where the second coil CF2-2 among the first sensing coils CF1-1, CF1-2, CF1-3, CF2-1, CF2-2, and CF2-3 and the second coil RF2-2 among the second sensing coils RF1-1, RF1-2, RF1-3, RF2-1, RF2-2, and RF2-3 cross each other may define an input point PP.

The sensing signal output from the second coil CF2-2 among the first sensing coils CF1-1, CF1-2, CF1-3, CF2-1, CF2-2, and CF2-3 has a higher level than the sensing signals output from the remaining first sensing coils CF1-1, CF1-2, CF1-3, CF2-1, and CF2-3.

The sensing signal output from the second coil RF2-2 among the second sensing coils RF1-1, RF1-2, RF1-3, RF2-1, RF2-2, and RF2-3 has a higher level than the sensing signals output from the remaining second sensing coils RF1-1, RF1-2, RF1-3, RF2-1, and RF2-3.

The sensing signals output from the first coil RF2-1 and the third coil RF2-3 among the second sensing coils RF1-1, RF1-2, RF1-3, RF2-1, RF2-2, RF2-3 have a lower level than the sensing signal output from the second coil RF2-2, and the sensing signals output from the first coil RF2-1 and the third coil RF2-3 among the second sensing coils RF1-1, RF1-2, RF1-3, RF2-1, RF2-2, RF2-3 have a higher level than the sensing signals output from the remaining second sensing coils RF1-1, RF1-2, and RF1-3.

Based on the time when the sensing signal output from the second coil RF2-2 having a high level is detected and the relative position of the second coil RF2-2 to the second sensing coils RF1-1, RF1-2, RF1-3, RF2-1, and RF2-3, two-dimensional coordinate information of the input point PP through the pen SP may be calculated.

According to an embodiment, some of the sensing coils CF1-1, CF1-2, CF1-3, CF2-1, CF2-3, RF1-1, RF1-2, RF1-3, RF2-1, and RF2-3 may be omitted in an area overlapping the folding area FA to be spaced apart from the folding area FA, but not being limited thereto.

Referring to FIG. 8, an embodiment of the detection sensor 500 may include a first sensor adhesive layer 510, a second sensor adhesive layer 530, a digitizer 520, and a shielding layer 540. In such an embodiment, the detection sensor 500 may be disposed between the cushion member CM and the upper plate 610.

In such an embodiment, a shielding opening 540-OP may be defined in the shielding layer 540. The shielding opening 540-OP may overlap the folding area FA. The shielding opening 540-OP may be defined by a side surface of the shielding layer 540 overlapping the folding area FA and through the shielding layer 540.

The shielding openings 540-OP may be provided in plural to be arranged along the first direction DR1 crossing the second direction DR2 which is an extension direction of imaginary folding axes AX1 and AX2.

The shielding opening 540-OP may expose a portion 530-E of the rear surface of the second sensor adhesive layer 530 in contact with the shielding layer 540.

According to an embodiment of the invention, the shielding opening 540-OP may have a width WD in a range of about 0.1 millimeter (mm) to about 1.0 mm in the first direction DR1. If the shielding opening 540-OP has a width of less than 0.1 mm, the shielding layer 540 including metal is disposed below the display panel 100, and the stress applied to the display panel 100 during folding operation may thus increase. If the shielding opening 540-OP has a width of greater than 1.0 mm, it may cause an issue that components disposed below the detection sensor 500 may be viewed by users through the shielding opening 540-OP.

The shielding opening 540-OP may overlap the lower opening 611 defined in the upper plate 610. The shielding opening 540-OP and the lower opening 611 may each be provided in plurality, and the shielding opening 540-OP and the lower opening 611 corresponding in the third direction DR3 may be aligned with each other. That is, a side surface of the shielding layer 540 defining the shielding opening 540-OP may be aligned with a side surface of the upper plate 610 defining the lower opening 611 in the third direction DR3.

According to embodiments of the invention, the shielding opening 540-OP and the lower opening 611 may be formed through a single process. In one embodiment, for example, a magnetic metal powder layer (an initial shielding layer) constituting the shielding layer 540 on a metal substrate (an initial upper plate) constituting the upper plate 610 may be formed, and then, the metal substrate and the magnetic metal powder layer may be punched together to form the shielding opening 540-OP and the lower opening 611.

Accordingly, the process time and cost for forming the shielding opening 540-OP and the lower opening 611 may be reduced, and the shielding opening 540-OP and the lower opening 611 may be formed to be aligned with each other in the third direction DR3.

Accordingly, in such an embodiment, even when the detection sensor 500 includes the shielding layer 540, the shape of the detection sensor 500 overlapping the folding area FA may be more easily deformed during folding operation by the shielding opening 540-OP overlapping the lower opening 611. In such an embodiment, the stress applied to a portion of the digitizer 520 overlapping the folding area FA is reduced, and disconnection of coils included in the digitizer 520 may thus be effectively prevented. Therefore, an electronic apparatus EA may have improved reliability.

Figure 9:
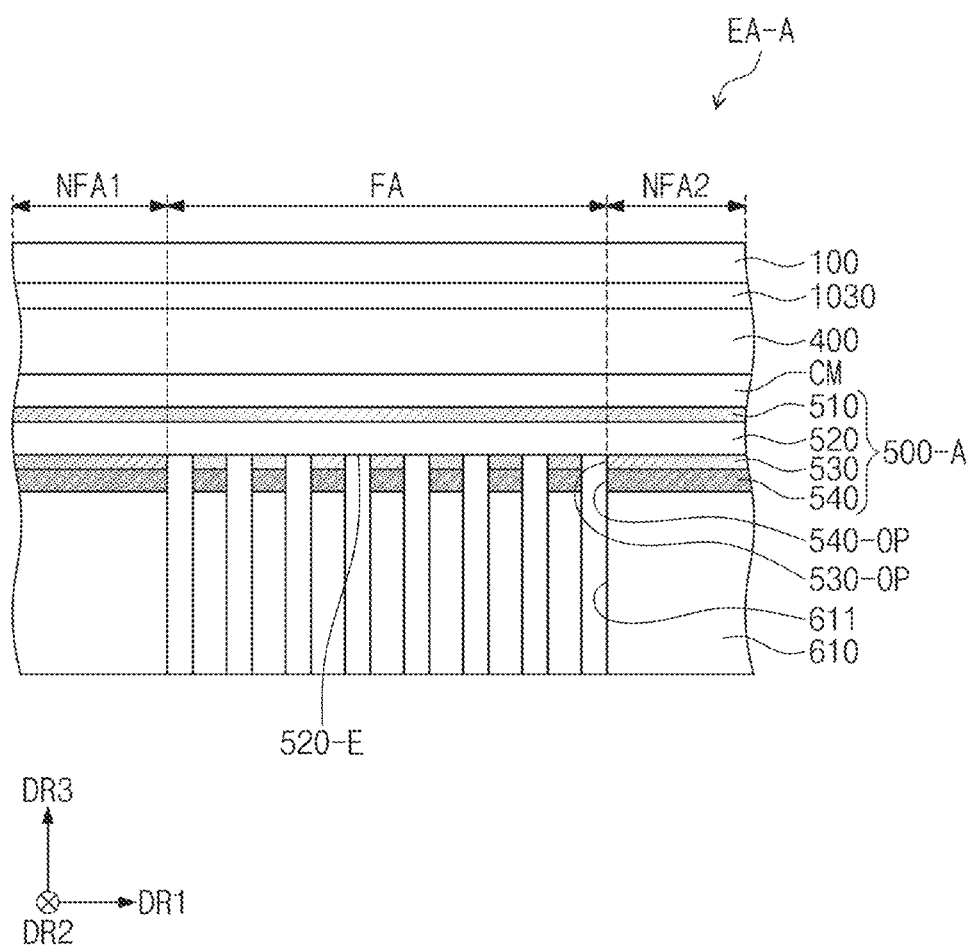
FIG. 9 is a cross-sectional view illustrating some components of an electronic apparatus overlapping a folding area according to an alternative embodiment of the invention.
Figure 10:
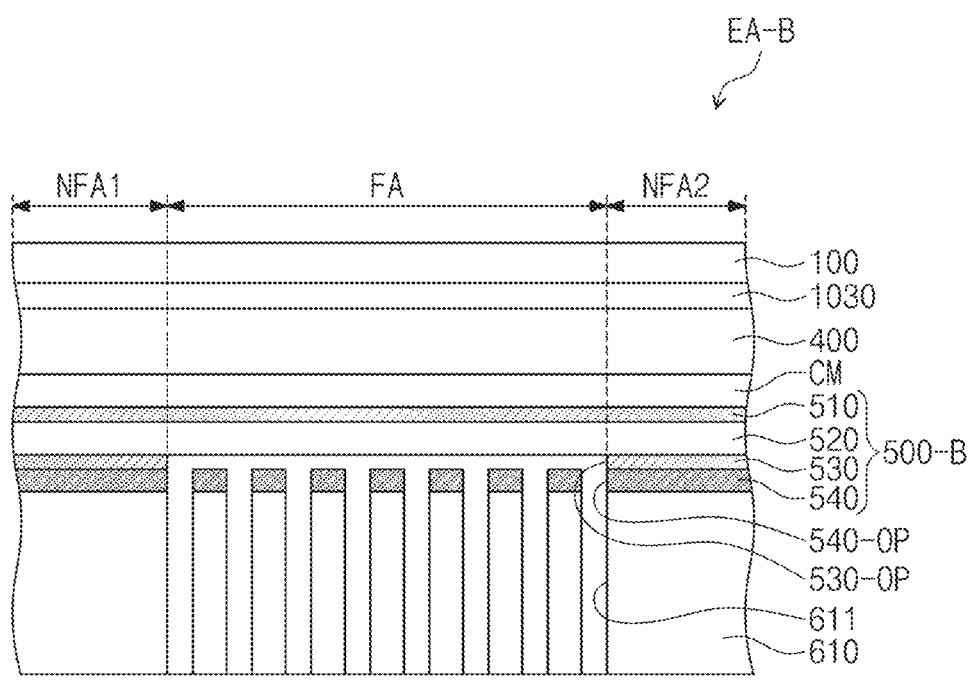
FIG. 10 is a cross-sectional view illustrating some components of an electronic apparatus overlapping a folding area according to another alternative embodiment of the invention.

FIG. 9 is a cross-sectional view illustrating some components of an electronic apparatus overlapping a folding area according to an alternative embodiment of the invention. FIG. 10 is a cross-sectional view illustrating some components of an electronic apparatus overlapping a folding area according to another alternative embodiment of the invention. Electronic apparatuses EA-A and EA-B shown in FIGS. 9 and 10 include the same or like components as those of the electronic apparatus EA shown in FIG. 3A, and some components are omitted for convenience of illustration and description.

The lower protective film 400, the cushion member CM, and the upper plate 610 shown in FIGS. 9 and 10 are the same as the lower protective film 400, the cushion member CM, and the upper plate 610 described above with reference to FIG. 3A, and any repetitive detailed description thereof will be omitted.

Referring to FIG. 9, an embodiment of the electronic apparatus EA-A includes a detection sensor 500-A. The detection sensor 500-A may include a first sensor adhesive layer 510, a second sensor adhesive layer 530, a digitizer 520, and a shielding layer 540. In such an embodiment, the detection sensor 500 may be disposed between the cushion member CM and the upper plate 610.

In such an embodiment, an adhesive opening 530-OP may be defined in the second sensor adhesive layer 530. The adhesive opening 530-OP may overlap the folding area FA. The adhesive opening 530-OP may overlap the folding area FA and may be defined by a side surface of the second sensor adhesive layer 530 and through the second sensor adhesive layer 530.

The adhesive opening 530-OP may be provided in plural to be arranged along the first direction DR1 crossing the second direction DR2 which is an extension direction of imaginary folding axes AX1 and AX2.

The second sensor adhesive layer 530 may expose a portion 520-E of the rear surface of the digitizer 520 in contact with the second sensor adhesive layer 530 through the adhesive opening 530-OP.

The adhesive opening 530-OP may overlap the shielding opening 540-OP defined in the shielding layer 540 and the lower opening 611 defined in the upper plate 610.

In an embodiment, the adhesive opening 530-OP, the shielding opening 540-OP, and the lower opening 611 are each provided in plural, and the adhesive opening 530-OP and the shielding opening 540-OP and the lower opening 611 corresponding in the third direction DR3 may be aligned with each other. In such an embodiment, a side surface of the second sensor adhesive layer 530 defining the adhesive opening 530-OP may be aligned with a side surface of the shielding layer 540 defining the shielding opening 540-OP and a side surface of the upper plate 610 defining the lower opening 611 in the third direction DR3.

Referring to FIG. 10, an alternative embodiment of the electronic apparatus EA-B includes a detection sensor 500-B. The detection sensor 500-B may include a first sensor adhesive layer 510, a second sensor adhesive layer 530, a digitizer 520, and a shielding layer 540. In such an embodiment, the detection sensor 500 may be disposed between the cushion member CM and the upper plate 610.

In such an embodiment, an adhesive opening 530-OP may be defined in the second sensor adhesive layer 530. The adhesive opening 530-OP may overlap the whole area of the folding area FA. The adhesive opening 530-OP may overlap the whole area of the folding area FA and be defined by a side surface of the second sensor adhesive layer 530 and through the second sensor adhesive layer 530. Therefore, in such an embodiment, the second sensor adhesive layer 530 may non-overlap the folding area FA.

The second sensor adhesive layer 530 may expose, a portion of the rear surface of the digitizer 520 overlapping the folding area FA through the adhesive opening 530-OP.

In such an embodiment, the adhesive opening 530-OP may overlap all of the shielding openings 540-OP and the lower openings 611 aligned with each other.

Figure 11:
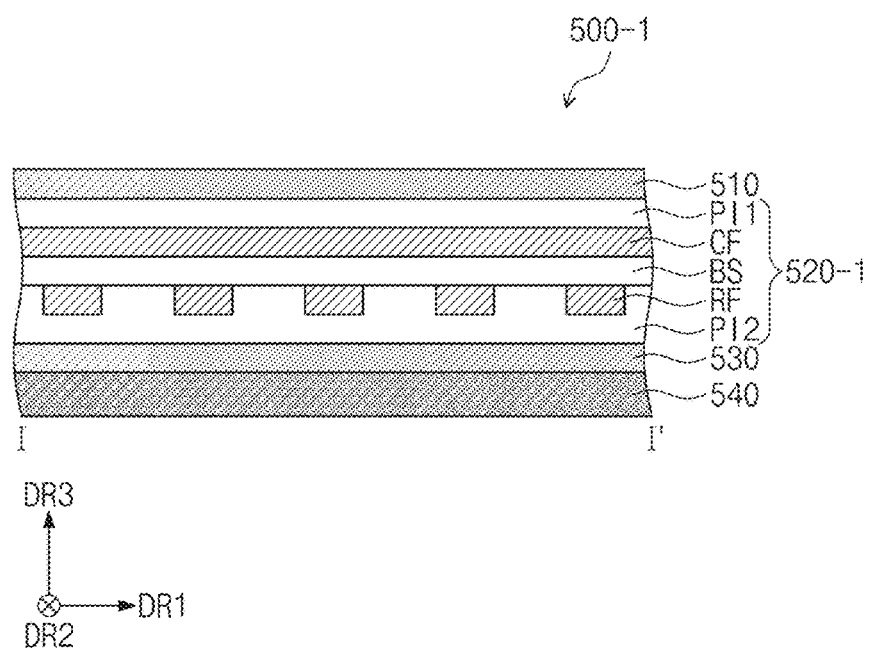
FIG. 11 is a cross-sectional view taken along line I-I' of FIG. 7.
Figure 12:
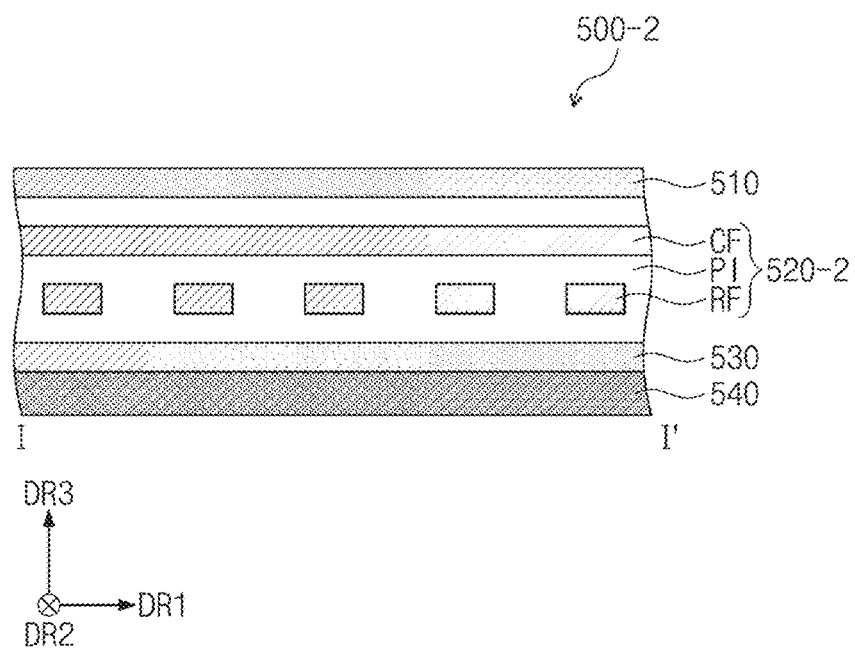
FIG. 12 is a cross-sectional view of a detection sensor according to an embodiment of the invention.
Figure 13:
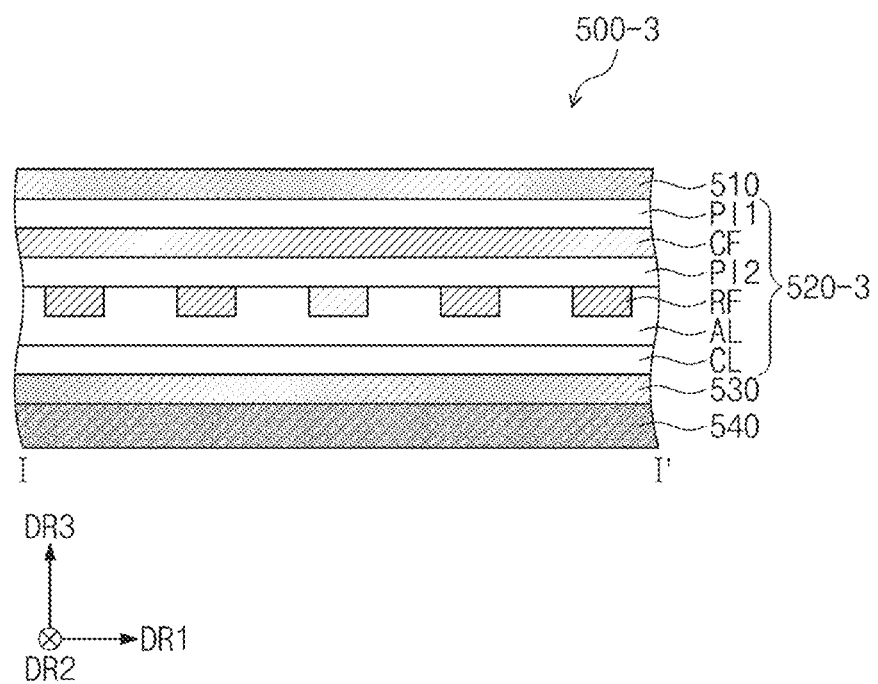
FIG. 13 is a cross-sectional view of a detection sensor according to an embodiment of the invention.

FIG. 11 is a cross-sectional view taken along line I-I' of FIG. 7. FIG. 12 is a cross-sectional view of a detection sensor according to an embodiment of the invention. FIG. 13 is a cross-sectional view of a detection sensor according to an embodiment of the invention. In FIGS. 11 to 13, the same/similar reference numerals are used for the same/similar components as those in FIGS. 1 to 10, and any repetitive detailed description thereof will be omitted or simplified. Hereinafter, embodiments of the detection sensor 500-1, 500-2 and 500-3 which will be described with reference to FIGS. 11 to 13 may all be applied to embodiments of the electronic apparatus (e.g., EA, EA-A and EA-B) described above with reference to FIGS. 1 to 10.

Referring to FIG. 11, an embodiment of the detection sensor 500-1 may include a first sensor adhesive layer 510, a second sensor adhesive layer 530, a shielding layer 540, and a digitizer 520-1.

In such an embodiment, the digitizer 520-1 may include a first cover layer PI1, a first sensing coil CF, a base layer BS, a second sensing coil RF, and a second cover layer PI2.

The base layer BS, the first cover layer PI1, and the second cover layer PI2 may include organic materials. In one embodiment, for example, the organic materials may be PI. In such an embodiment, the organic materials included in the first cover layer PI1 and the second cover layer PI2 may include photosensitive polyimide, but are not limited thereto.

The first sensing coil CF may be one of the first sensing coils CF1-1, CF1-2, CF1-3, CF2-1, CF2-2, or CF2-3 described above with reference to FIG. 7, and the second sensing coil RF may be one of the second sensing coils RF1-1, RF1-2, RF1-3, RF2-1, RF2-2, and RF2-3 described above with reference to FIG. 7.

In such an embodiment, the first sensing coil CF may be disposed directly on a front of the base layer BS adjacent to the display panel 100 (see FIG. 3A), and the second sensing coil RF may be disposed directly on a rear surface of the base layer BS opposite to the front surface.

The first cover layer PI1 may cover the front surface of the base layer BS, and a first sensor adhesive layer 510 may be disposed on the first cover layer PI1. The second cover layer PI2 may cover the rear surface of the base layer BS, and a second sensor adhesive layer 530 may be disposed on the second cover layer PI2. The shielding layer 540 may be bonded to the second cover layer PI2 through the second sensor adhesive layer 530.

In such an embodiment, any one of the coils CF or RF in a portion overlapping the folding area FA (see FIG. 3A) may be omitted.

Referring to FIG. 12, an alternative embodiment of the detection sensor 500-2 may include a first sensor adhesive layer 510, a second sensor adhesive layer 530, a shielding layer 540, and a digitizer 520-2.

In such an embodiment, the digitizer 520-2 may include a first sensing coil CF, a base layer PI, and a second sensing coil RF.

In such an embodiment, the first sensing coil CF and the second sensing coil RF may be disposed to be embedded in the base layer PI. Herein, "embedded" may indicate that component "b" is disposed inside components "a" without separating layers.

The first sensing coil CF may be disposed relatively closer to the display panel 100 than the second sensing coil RF, and the second sensing coil RF may be disposed relatively closer to the shielding layer 540 than the first sensing coil CF. The first sensing coil CF and the second sensing coil RF may be insulated from each other in the base layer PI to be spaced apart from each other.

Referring to FIG. 13, another alternative embodiment of the detection sensor 500-3 may include a first sensor adhesive layer 510, a second sensor adhesive layer 530, a shielding layer 540, and a digitizer 520-3.

In such an embodiment, the digitizer 520-3 may include a first cover layer PI1, a first sensing coil CF, a second cover layer PI2, a second sensing coil RF, a sensing adhesive layer AL, and a protective layer CL.

In such an embodiment, the first sensing coil RF is disposed on the first cover layer PI1. The second cover layer PI2 covers the first sensing coil CF. The second sensing coil RF is disposed on the second cover layer PI2.

The sensing adhesive layer AL is disposed between the protective layer CL and the second cover layer PI2 to bond the protective layer CL and the second cover layer PI2. The sensing adhesive layer AL may be an OCA, an OCR, or a PSA. In an embodiment, the sensing adhesive layer AL includes a photocurable adhesive material or a thermosetting adhesive material, but the material thereof is not particularly limited.

The protective layer CL is disposed on the second cover layer PI2 to reduce stress applied to the detection sensor 500-3 during folding operation. The protective layer CL may include an organic material.

Figure 14:
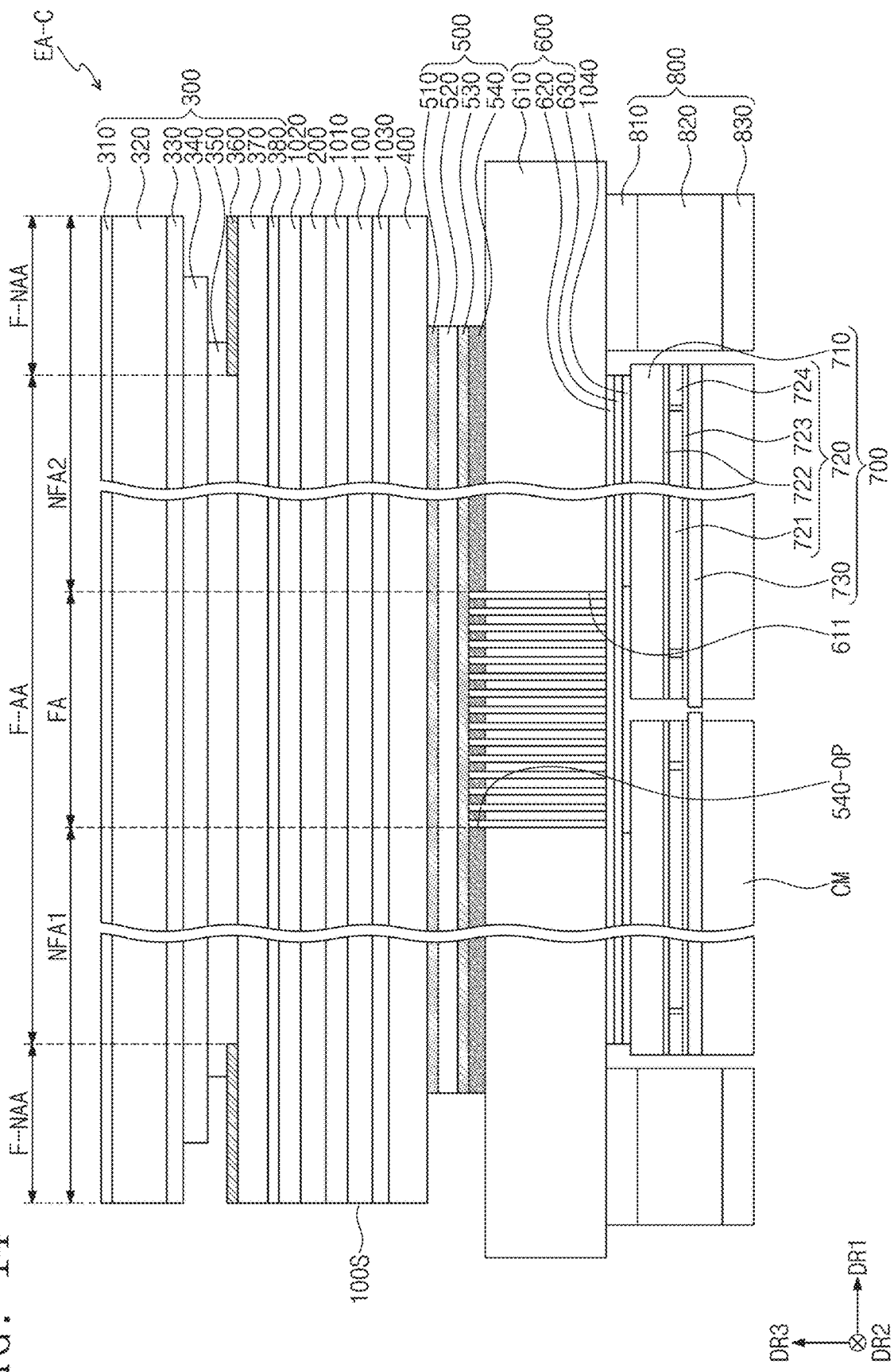
FIG. 14 is a cross-sectional view of some components of an electronic apparatus according to an embodiment of the invention.

FIG. 14 is a cross-sectional view of some components of an electronic apparatus according to an embodiment of the invention. In FIG. 14, the same/similar reference numerals are used for the same/similar components as those described above with reference to FIG. 3A, and any repetitive detailed description thereof will be omitted or simplified.

Referring to FIG. 14, an embodiment of the electronic apparatus EA-C may include a display panel 100, a detection sensor 500, upper functional layers, and lower functional layers.

The upper functional layers may be disposed on the display panel 100. In one embodiment, for example, the upper functional layers may include an anti-reflection member 200 and an upper member 300.

The lower functional layers may be disposed below the display panel 100. In one embodiment, for example, the lower functional layers may include a lower protective film 400, a lower member 600, a functional member 700, a step compensation member 800, and a cushion member CM. The functional member 700 may be disposed below the lower member 600. The functional member 700 may be provided in plurality to be spaced apart from each other. In one embodiment, for example, one functional member 700 may be disposed in the first non-folding area NFA1, and another functional member 700 may be disposed in the second non-folding area NFA2.

The functional members 700 may each include a lower plate 710, a heat dissipation sheet 720, and an insulating film 730. Components included in the functional members 700 each are not limited to the components described above. Alternatively, at least some of the components described above may be omitted, or another component may be added.

The lower plate 710 is provided in plural. One of the lower plates 710 may be disposed to overlap the first non-folding area NFA1 and a portion of the folding area FA, and the other of the lower plates 710 may be disposed to overlap another portion of the folding area FA and the second non-folding area NFA2.

The lower plates 710 may be disposed to be spaced apart from each other in the folding area FA. In such an embodiment, the lower plates 710 may be disposed as close as possible to support an area in which the lower opening 611 of the upper plate 610 is formed. In one embodiment, for example, the lower plates 710 may prevent the shape of the area in which the lower opening 611 of the upper plate 610 is defined from being deformed due to pressure applied from the top.

In such an embodiment, the lower plates 710 may serve to prevent the shape of the components disposed on the functional members 700 from being deformed due to the components disposed below the functional member 700.

The lower plates 710 may each include a metal alloy, and for example, the lower plates 710 may each include a copper alloy. However, materials forming the lower plates 710 are not limited thereto.

The heat dissipation sheet 720 may be attached below the lower plate 710. The heat dissipation sheet 720 may be a heat conduction sheet having high thermal conductivity. In one embodiment, for example, the heat dissipation sheet 720 may include a heat dissipation layer 721, a first heat dissipation adhesive layer 722, a second heat dissipation adhesive layer 723, and a gap tape 724.

The gap tape 724 may be attached to the first heat dissipation adhesive layer 722 and the second heat dissipation adhesive layer 723, which are spaced apart from each other with the heat dissipation layer 721 therebetween. The gap tape 724 may have a plurality of layers. In one embodiment, for example, the gap tape 724 may include a base layer, an upper adhesive layer disposed on an upper surface of the base layer, and a lower adhesive layer disposed on a lower surface of the base layer.

The heat dissipation layer 721 may be attached to the lower plate 710 through the first heat dissipation adhesive layer 722. The heat dissipation layer 721 may be sealed through the first heat dissipation adhesive layer 722, the second heat dissipation adhesive layer 723, and the gap tape 724. The heat dissipation layer 721 may be a graphitized polymer film. The polymer film may be, for example, a polyimide film.

The insulating film 730 may be attached below the heat dissipation sheet 720. In one embodiment, for example, the insulating film 730 may be attached to the second heat dissipation adhesive layer 723. In such an embodiment, the insulating film 730 may effectively prevent rattle from being caused in the electronic apparatus EA-C. The thickness of the insulating film 730 may be about 15 µm, but is not limited thereto.

In an embodiment, the cushion member CM included in the electronic apparatus EA-C may be disposed below the functional member 700. According to an embodiment, the components disposed on the detection sensor 500 decrease, and sensing sensitivity may thus increase, and stress applied to the detection sensor 500 due to the cushion member CM during in-folding operation may be reduced.

In such an embodiment where a detection sensor includes a shielding layer, the shape of the detection sensor overlapping a folding area may be more easily deformed by a shielding opening overlapping a lower opening defined in a lower member.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic apparatus comprising:
   a display panel including non-folding areas arranged along a first direction, and a folding area disposed between the non-folding areas and folded along an imaginary folding axis extending in a second direction crossing the first direction;
   a lower protective film disposed below the display panel;
   a cushion member disposed below the display panel;
   a detection sensor disposed below the lower protective film, wherein the detection sensor includes a digitizer including first sensing coils and second sensing coils, which are insulated and spaced apart from each other, and a shielding layer disposed below the digitizer;
   a lower member disposed below the detection sensor, wherein
   the shielding layer overlaps the folding area,
   a shielding opening is defined through the shielding layer,
   the lower member overlaps the shielding opening, and
   a lower opening is defined by and through the lower member.

2. The electronic apparatus of claim 1, wherein
   the detection sensor comprises an adhesive layer bonding the digitizer and the shielding layer to each other,
   the adhesive layer overlaps the shielding opening,
   an adhesive opening is defined through the adhesive layer.

3. The electronic apparatus of claim 2, wherein a side surface of the adhesive layer defining the adhesive opening and a side surface of the shielding layer defining the shielding opening are aligned with each other along a thickness direction of the display panel.

4. The electronic apparatus of claim 3, wherein a side surface of the lower member defining the lower opening and the side surface of the shielding layer defining the shielding opening are aligned with each other along the thickness direction.

5. The electronic apparatus of claim 2, wherein the adhesive opening overlaps a whole area of the folding area.

6. The electronic apparatus of claim 1, wherein the shielding opening has a width in a range of about 0.1 mm to about 1.0 mm in the first direction.

7. The electronic apparatus of claim 1, wherein the shielding layer comprises a magnetic metal powder.

8. The electronic apparatus of claim 1, further comprising:
   a functional member disposed below the lower member, wherein the functional member includes at least one selected from a lower plate, a heat dissipation sheet, and an insulating film.

9. The electronic apparatus of claim 8, wherein the lower plate is provided in plural to be spaced apart from each other with respect to the folding area and to overlap a corresponding non-folding area among the non-folding areas.

10. The electronic apparatus of claim 8, wherein the cushion member is disposed below the functional member.

11. The electronic apparatus of claim 1, wherein the shielding layer is in contact with the lower member.

12. The electronic apparatus of claim 1, wherein the display panel comprises:
    a display layer including a plurality of pixels; and
    a sensor layer disposed directly on the display layer, wherein the sensor layer detects an external input.

13. The electronic apparatus of claim 1, wherein the detection sensor detects an external input through an electromagnetic resonance method.

14. The electronic apparatus of claim 1, wherein the digitizer comprises:
    a base layer including a front surface adjacent to the display panel and a rear surface opposite to the front surface;
    the first sensing coils disposed on the front surface of the base layer;
    a first cover layer covering the front surface of the base layer;
    the second sensing coils disposed on the rear surface of the base layer; and
    a second cover layer covering the rear surface of the base layer.

15. The electronic apparatus of claim 1, wherein the digitizer comprises:
    a base layer including polyimide;
    the first sensing coils adjacent to the display panel and embedded in the base layer; and
    the second sensing coils adjacent to the lower member and embedded in the base layer.

16. The electronic apparatus of claim 1, wherein the digitizer comprises:
    a first cover layer;
    the first sensing coils disposed on the first cover layer;
    a second cover layer covering the first sensing coils;
    the second sensing coils disposed on the second cover layer;
    a sensing adhesive layer covering the second sensing coils; and
    a protective layer disposed on the sensing adhesive layer.

17. An electronic apparatus comprising:
    a display panel including non-folding areas arranged along a first direction, and a folding area disposed between the non-folding areas and folded along an imaginary folding axis extending in a second direction crossing the first direction;
    a lower protective film disposed below the display panel;
    a cushion member disposed below the display panel;
    a detection sensor disposed below the lower protective film, wherein the detection sensor includes a digitizer including first sensing coils and second sensing coils, which are insulated and spaced apart from each other, and a shielding layer disposed below the digitizer, wherein a shielding opening is defined through a portion of the shielding layer overlapping the folding area; and
    a lower member disposed below the detection sensor, wherein a lower opening is defined through a portion of the lower member overlapping the folding area,
    wherein a side surface of the lower member defining the lower opening is aligned with a side surface of the shielding layer defining the shielding opening.

18. The electronic apparatus of claim 17, wherein
    the detection sensor comprises an adhesive layer bonding the digitizer and the shielding layer to each other,
    the adhesive layer overlapping the shielding opening, and
    an adhesive opening is defined through the adhesive layer.

19. The electronic apparatus of claim 18, wherein a side surface of the adhesive layer defining the adhesive opening and the side surface of the shielding layer defining the shielding opening are aligned with each other along a thickness direction of the display panel.

20. A method for manufacturing an electronic apparatus, the method comprising:

providing an initial shielding layer including a magnetic metal powder on an initial upper plate including a metal;

providing an upper plate by forming a plurality of lower openings through the initial upper plate;

providing a shielding layer by forming a plurality of shielding openings through the initial shielding layer aligned with the lower openings;

providing a digitizer on the shielding layer, wherein the digitizer includes first sensing coils and second sensing coils, which are insulated and spaced apart from each other; and attaching a display panel to the digitizer, wherein the lower openings and the shielding openings are formed by forming openings through the initial upper plate and the initial shielding layer together.

* * * * *